(12) United States Patent
Liu et al.

(10) Patent No.: US 7,912,147 B2
(45) Date of Patent: Mar. 22, 2011

(54) COMPRESS-FORWARD CODING WITH N-PSK MODULATION FOR THE HALF-DUPLEX GAUSSIAN RELAY CHANNEL

(75) Inventors: Zhixin Liu, College Station, TX (US); Vladimir M. Stanković, Lancaster (GB); Zixiang Xiong, Spring, TX (US)

(73) Assignee: The Texas A&M University System, College Station, TX (US)

( * ) Notice: Subject to any disclaimer, the term of this patent is extended or adjusted under 35 U.S.C. 154(b) by 958 days.

(21) Appl. No.: 11/686,019

(22) Filed: Mar. 14, 2007

(65) Prior Publication Data

US 2007/0217541 A1    Sep. 20, 2007

Related U.S. Application Data

(60) Provisional application No. 60/782,367, filed on Mar. 15, 2006.

(51) Int. Cl.
*H04L 27/00* (2006.01)
(52) U.S. Cl. ........................................ 375/295
(58) Field of Classification Search ............... 375/279, 375/295, 250, 260; 370/467; 714/765
See application file for complete search history.

(56) References Cited

U.S. PATENT DOCUMENTS

| | | | |
|---|---|---|---|
| 5,499,254 A | 3/1996 | Ikekawa et al. | |
| 7,746,758 B2 | 6/2010 | Stolpman | |
| 2005/0169411 A1* | 8/2005 | Kroeger | 375/350 |
| 2005/0265387 A1* | 12/2005 | Khojastepour et al. | 370/467 |
| 2007/0162818 A1* | 7/2007 | Shen et al. | 714/755 |
| 2008/0260053 A1* | 10/2008 | Yun et al. | 375/260 |

OTHER PUBLICATIONS

Yang et al. ("Wyner-Ziv Coding Based on TCQ and LDPC Codes," in Proc. of 37th Asilomar Conference on Signals, Systems, and Computers, pp. 1-5, Pacific Grove, CA, Nov. 2003).*
Azarian et al., "On the Achievable Diversity-Multiplexing Tradeoff in Half-Duplex Cooperative Channels," IEEE Trans. Inform. Theory, vol. 51, No. 12, pp. 4152-4172, Dec. 2005.
Chakrabarti et al., "Half-Duplex Estimate-and-Forward Relaying: Bounds and Code Design," in Proc. ISIT-2006, pp. 1239-1243, Seattle, WA, Jul. 2006.
Chong et al., "New Coding Strategies for the Relay Channel," in Proc. ISIT-2005, Adelaide, Australia, Sep. 2005.
Cover et al., "Capacity Theorems for the Relay Channel," IEEE Trans. Inform. Theory, vol. IT-25, No. 5, pp. 572-584, Sep. 1979.

(Continued)

*Primary Examiner* — David C Payne
*Assistant Examiner* — Leon-Viet Q Nguyen
(74) *Attorney, Agent, or Firm* — Knobbe, Martens, Olson & Bear LLP

(57) ABSTRACT

Systems and methods that implement compress-forward (CF) coding with N-PSK modulation for the relay channel are disclosed, where N is greater than or equal to two. In the CF scheme, Wyner-Ziv coding is applied at the relay to exploit the joint statistics between signals at the relay and the destination. Quantizer design and selection of channel code parameters are discussed. Low-density parity check (LDPC) codes are used for error protection at the source, and nested scalar quantization (NSQ) and irregular repeat accumulate (IRA) codes for Wyner Ziv coding (or more precisely, distributed joint source-channel coding) at the relay. The destination system decodes original message information using (a) a first signal received from the source in a first interval and (b) a second signal that represents a mixture of transmissions from the source and relay in the second interval.

24 Claims, 16 Drawing Sheets

OTHER PUBLICATIONS

Garcia-Frias, "Joint Source-Channel Decoding of Correlated Sources Over Noisy Channels," in Proc. DCC-2001, pp. 283-292, Snowbird, UT, Mar. 2001.

Host-Madsen et al., "Capacity Bounds and Power Allocation for Wireless Relay Channels," IEEE Trans. Inform. Theory, vol. 51, No. 6, pp. 2020-2040, Jun. 2005.

Hu et al., "Practical Compress-Forward in User Cooperation: Wyner-Ziv Cooperation," in Proc. ISIT-2006, pp. 489-493, Seattle, WA, Jul. 2006.

Hunter et al., "Diversity Through Coded Cooperation," IEEE Trans. Wireless Comm., vol. 5, No. 2, pp. 283-289, Feb. 2006.

Janani et al., "Coded Cooperation in Wireless Communications: Space-Time Transmission and Iterative Decoding," IEEE Trans. Signal Processing, vol. 52, No. 2, pp. 362-371, Feb. 2004.

Jin et al., "Irregular Repeat-Accumulate Codes," in Proc. 2nd Int. Symp. Turbo codes and related topics, pp. 1-8, Sep. 2000.

Khojastepour et al., "On Capacity of Gaussian 'Cheap' Relay Channel," in Proc. Globecom-2003, pp. 1776-1780, San Francisco, CA, Dec. 2003.

Khojastepour et al., "Lower Bounds on the Capacity of Gaussian Relay Channel," in Proc. CISS-2004, pp. 1-6, Princeton, NJ, Mar. 2004.

Kramer et al., "Cooperative Strategies and Capacity Theorems for Relay Networks," IEEE Trans. Inform. Theory, vol. 51, No. 9, pp. 3037-3063, Sep. 2005.

Laneman et al., "Cooperative Diversity in Wireless Networks: Efficient Protocols and Outage Behavior," IEEE Trans. Inform. Theory, vol. 50, No. 12, pp. 3062-3080, Dec. 2004.

Laneman et al., "Distributed Space-Time Coded Protocols for Exploiting Cooperative Diversity in Wireless Networks," IEEE Trans. Inform. Theory, vol. 49, No. 10, pp. 2415-2425, Oct. 2003.

Liu et al., Practical Compress-and-Forward Code Design for the Half-Duplex Relay Channel, in Proc. CISS-2005, pp. 1-6, Baltimore, MD, Mar. 2005.

Liu et al., "Slepian-Wolf Coded Nested Lattice Quantization for Wyner-Ziv Coding: High-Rate Performance Analysis and Code Design," IEEE Trans. Inform. Theory, vol. 52, No. 10, pp. 4358-4379, Oct. 2006.

Liveris et al., "Compression of Binary Sources with Side Information at the Decoder Using LDPC Codes," IEEE Communications Letters, vol. 6, No. 10, pp. 440-442, Oct. 2002.

Liveris et al., "Joint Source-Channel Coding of Binary Sources with Side Information at the Decoder Using IRA Codes," in Proc. MMSP-2002, pp. 53-56, St. Thomas, US Virgin Islands, Dec. 2002.

Marcellin et al., "Trellis Coded Quantization of Memoryless and Gauss-Markov Sources," IEEE Trans. Comm., vol. 38, No. 1, pp. 82-93, Jan. 1990.

Mitran et al., "Turbo Source Coding: A Noise-Robust Approach to Data Compression," in Proc. DCC-2002, Snowbird, UT, Mar. 2002.

Nabar et al., "Fading Relay Channels: Performance Limits and Space-Time Signal Design," IEEE JSAC, vol. 22, No. 6, pp. 1099-1109, Aug. 2004.

Sartipi et al., "Source and Channel Coding in Wireless Sensor Networks Using LDPC Codes," in Proc. 1st Annual IEEE Communications Society Conf on Sensor Communications and Networks, pp. 309-316, Santa Clara, CA, Oct. 2004.

Sendonaris et al., "User Cooperation Diversity Part I and Part II," IEEE Trans. Comm., vol. 51, No. 11, pp. 1927-1948, Nov. 2003.

Shamai et al., "Capacity of Channels with Uncoded Side Information," European Trans. Telecommunications, vol. 6, pp. 587-600, Sep. Oct. 1995.

Shamai et al., "Systematic Lossy Source/Channel Coding," IEEE Trans. Inform. Theory, vol. 44, No. 2, pp. 564-579, Mar. 1998.

Shannon, "A Mathematical Theory of Communication," Mobile Computing and Communications Review, vol. 5, No. 1, pp. 3-55., Jan. 2005 (reprinted for the Bell System Technical Journal with corrections, Copyright 1948).

Slepian et al., "Noiseless Coding of Correlated Information Sources," IEEE Trans. Inform. Theory, vol. IT-19, No. 4, pp. 471-480, Jul. 1973.

Stefanov et al., "Cooperative Coding for Wireless Networks," IEEE Trans. Communications, vol. 52, No. 9, pp. 1470-1476, Sep. 2004.

Telater, "Capacity of Multi-Antenna Gaussian Channels," European Transaction on telecommunications, vol. 10, No. 6, pp. 585-595, Nov. Dec. 1999.

Zhao et al., "Distributed Turbo Coded Diversity for Relay Channel," IEE Electronics Letters, vol. 39, No. 10, pp. 786-787, May 2003.

Willems et al., "The Discrete Memoryless Multiple-Access Channel with Cribbing Encoders," IEEE Trans. Inform. Theory, vol. IT-31, No. 3, pp. 313-327, May 1985.

Wyner, "Recent Results in the Shannon Theory," IEEE Trans. Inform. Theory, vol. IT-20, No. 1, pp. 2-10, Jan. 1974.

Wyner et al., "The Rate-Distortion Function for Source Coding with Side Information at the Decoder," IEEE Trans. Inform. Theory, vol. IT-22, No. 1, pp. 1-10, Jan. 1976.

Gray, "A New Class of Lower Bounds to Information Rates of Stationary Sources Via Conditional Rate-Distortion Functions,"IEEE Trans. Inform. Theory, vol. IT-19, No. 4, pp. 480-489, Jul. 1973.

Zamir, "The Rate Loss in the Wyner-Ziv Problem," IEEE Trans. Inform. Theory, vol. 42, No. 6, pp. 2073-2084, Nov. 1996.

Guo et al., "Mutual Information and Minimum Mean-Square Error in Gaussian Channels," IEEE Trans. Inform. Theory, vol. 51, No. 4, pp. 1261-1282, Apr. 2005.

Xu et al., "Layered Wyner-Ziv Video Coding for Transmission Over Unreliable Channels," Signal Processing, vol. 86, pp. 3212-3225, 2006.

Yang et al., "Wyner-Ziv Coding Based on TCQ and LDPC Codes," in Proc. of 37th Asilomar Conference on Signals, Systems, and Computers, pp. 1-5, Pacific Grove, CA, Nov. 2003.

Zamir et al., "Nested Linear/Lattice Codes for Structured Multiterminal Binning," IEEE Trans. Inform. Theory, vol. 48, No. 6, pp. 1250-1276, Jun. 2002.

Zeng et al., "Achievablility Proof of Some Multiuser Channel Coding Theorems Using Backward Decoding," IEEE Trans. Inform. Theory, vol. 35, No. 6, pp. 1160-1165, Nov. 1989.

Zhang et al., "Capacity-Approaching Turbo Coding and Iterative Decoding for Relay Channels," IEEE Trans. Comm., vol. 53, No. 11, pp. 1895-1905, Nov. 2005.

Zhu et al., "Turbo Codes for Nonuniform Memoryless Sources Over Noisy Channels," IEEE Communications Letters, vol. 6, No. 2, pp. 64-66, Feb. 2002.

Liu et al., "Slepian-Wolf Coded Nested Quantization (SWC-NQ) for Wyner-Ziv Coding: Performance Analysis and Code Design," Proc. DCC-2004, pp. 1-10, Snowbird, UT, Mar. 2004.

Azarian et al., "Achievable Diversity -vs- Multiplexing Tradeoffs in Half-Duplex Cooperative Channels," Proc. ITW-2004, pp. 292-297, San Antonio, TX, Oct. 2004.

Hunter et al., "Performance Analysis of Coded Cooperation Diversity," Proc. ICC-2003, pp. 2688-2692, Anchorage, AK, May 2003.

Xiong et al., "Distributed Source Coding for Sensor Networks," IEEE Signal Processing Magazine, vol. 21, pp. 80-94, Sep. 2004.

Host-Madsen, "Capacity Bounds for Cooperative Diversity," IEEE Trans. Inform. Theory, vol. 52, No. 4, pp. 1522-1544, Apr. 2006.

Sun et al., "Near-Capacity Dirty-Paper Code Design: A Source-Channel Coding Approach," in Proc. CISS'05, pp. 1-6, Baltimore, MD, Mar. 2005.

Pradhan et al., "Distributed Compression in a Dense Microsensor Network," IEEE Signal Processing Magazine, vol. 19, pp. 51-60, Mar. 2002.

Stankovic et al., "On Code Design for the Slepian-Wolf Problem and Lossless Multiterminal Networks" IEEE Transactions on Information Theory, vol. 52, No. 4, Apr. 2006 pp. 1495-1507.

Xu et al., "Distributed Joint Source-Channel Coding of Video," to appear in Proc. ICIP-2005 IEEE International Conference on Image Processing, Genova, Italy, Sep. 2005.

Girod et al., "Distributed Video Coding," Proc. of the IEEE, vol. 93, pp. 1-12, Jan. 2005.

Sehgal et al., "Wyner-Ziv Coding of Video: An Error-Resilient Compression Framework," IEEE Trans. Multimedia, vol. 6, No. 2, pp. 249-258, Apr. 2004.

Puri et al., "PRISM: A New Robust Video Coding Architecture Based on Distributed Compression Principles," submitted to IEEE Trans. Image Processing, pp. 1-10, 2003.

Steinberg et al., "On Successive Refinement for the Wyner-Ziv Problem," IEEE Trans. Inform. Theory, vol. 50, pp. 1636-1654, No. 8, Aug. 2004.

Xu et al., "Layered Wyner-Ziv Video Coding," submitted to IEEE Trans. Image Processing, pp. 1-9, Jul. 2004.

Li, "Overview of Fine Granularity Scalability in MPEG-4 Video Standard", IEEE Trans. Circuits and Systems for Video Tech., vol. 11, No. 3, pp. 301-317, Mar. 2001.

Chung, "On the Construction of Some Capacity-Approaching Coding Schemes", Ph.D. dissertation, Massachusetts Institute of Technology, pp. 1-241, 2000.

Xiong et al., "Nested Quantization and Slepian-Wolf Coding: A Wyner-Ziv Coding Paradigm for I.I.D. Sources," in Proc. IEEE Workshop on Statistical Signal Processing, St. Louis, MO, pp. 399-402, Sep. 2003.

Aaron et al., "Compression with Side Information Using Turbo Codes," in Proc. DCC-2002 Data Compression Conference, Snowbird, UT, pp. 1-10, Apr. 2002.

Gastpar et al., "The Distributed Karhunen-Loeve Transform," submitted to IEEE Trans. Inform. Theory, Nov. 2004.

Stankovic et al., "Design of Slepian-Wolf Codes by Channel Code Partitioning," in Proc. DCC-2004 Data Compression Conference, Snowbird, UT, pp. 1-10, Mar. 2004.

Cheng et al., "Successive Refinement for the Wyner-Ziv Problem and Layered Code Design," in Proc. DCC-2004 Data Compression Conference, Snowbird, UT, Apr. 2004.

Forney Jr., "Coset Codes-I: Introduction and Geometrical Classification," IEEE Trans. Inform. Theory, vol. 34, No. 5, pp. 1123-1151, Sep. 1988.

Forney Jr., "Coset Codes-II: Binary Lattices and Related Codes," IEEE Trans. Inform. Theory, vol. 34, No. 5, pp. 1152-1187, Sep. 1988.

Shannon, "A Mathematical Theory of Communication," Reprinted with corrections from Bell Syst. Tech. J., vol. 27, pt. I, pp. 379-423, 1948; pt. II, pp. 623-656, Jul., Oct. 1948.

* cited by examiner

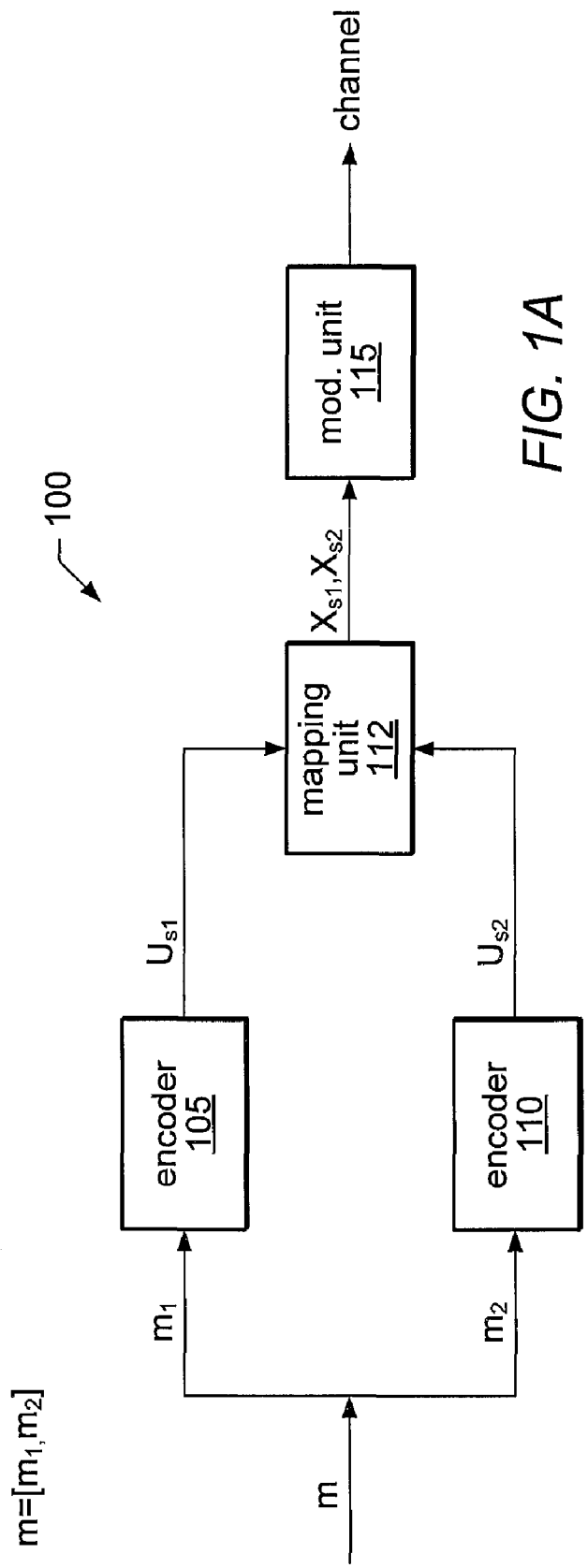

| Bit plane $j$ | Conditional entropy | $r_j/n\alpha$ | Degree polynomials | |
|---|---|---|---|---|
| | | | $\lambda(x)$ | $\rho(x)$ |
| 1 | 0.765635 | 0.77 | $0.246779x^2 + 0.160927x^3 + 0.0000215323x^4 + 0.0000265542x^5$ $+ 0.158502x^6 + 0.0366871x^8 + 0.0390752x^{12} + 0.0354665x^{19}$ $+ 0.0125102x^{20} + 0.116069x^{23} + 0.0000125083x^{98} + 0.0000207854x^{99}$ $+ 0.193904000x^{100}$ | $x^6$ |
| 2 | 0.178334 | 0.2 | $0.124799x^2 + 0.17686x^3 + 0.176933x^7 + 0.0424318x^8$ $+ 0.00796064x^9 + 0.0113302x^{19} + 0.134332x^{20} + 0.0389052x^{23}$ $+ 0.00866671x^{25} + 0.0330878x^{26} + 0.00100343x^{37} + 0.0517676x^{69}$ $+ 0.122933x^{74} + 0.0287246x^{77} + 0.0401743x^{80}$ | $x^{30}$ |

*FIG. 12A*
*(d=7m)*

| Bit plane $j$ | Conditional entropy | $r_j/n\alpha$ | Degree polynomials | |
|---|---|---|---|---|
| | | | $\lambda(x)$ | $\rho(x)$ |
| 1 | 0.818696 | 0.82 | $0.303792x^2 + 0.173188x^3 + 0.0671337x^5 + 0.0123568x^6$ $+ 0.134132x^7 + 0.0314767x^{13} + 0.0108393x^{15} + 0.025639x^{17}$ $+ 0.0910351x^{20} + 0.0400076x^{40} + 0.0000240473x^{46} + 0.0117242x^{52}$ $+ 0.0189157x^{58} + 0.0112433x^{63} + 0.0684922x^{77}$ | $x^5$ |
| 2 | 0.140643 | 0.19 | $0.114444x^2 + 0.179976x^3 + 0.14779x^7 + 0.0806827x^8$ $+ 0.0126197x^{17} + 0.0208893x^{19} + 0.132564x^{21} + 0.0366681x^{22}$ $+ 0.00152895x^{38} + 0.0606354x^{42} + 0.0197357x^{69} + 0.0334799x^{72}$ $+ 0.123705x^{79} + 0.0382818x^{87}$ | $x^{44}$ |

FIG. 12B
(d=9m)

COMPRESS-FORWARD CODING WITH N-PSK MODULATION FOR THE HALF-DUPLEX GAUSSIAN RELAY CHANNEL

PRIORITY DATA

This application claims the benefit of U.S. Provisional Application No. 60/782,367, filed on Mar. 15, 2006, entitled "Practical Compress-and-Forward Code Design for the Half-Duplex Relay Channel", invented by Liu, Stankovic and Xiong, which is hereby incorporated by reference in its entirety.

FIELD OF THE INVENTION

The present invention relates to the field of information encoding/decoding, and more particularly to systems and methods for implementing compress-and-forward coding for the relay channel.

DESCRIPTION OF THE RELATED ART

The relay channel, introduced by van der Meulen ("Three-terminal communication channels," Advanced Applied Probability, vol. 3, pp. 120-154, 1971), includes three terminals: the source, the relay and the destination. The source broadcasts a message to both the relay and the destination. The relay processes the message it receives from the source and forwards the processed signal to the destination, which reconstructs the original message by decoding the signals received from both the source and the relay.

According to the observe-forward (OF) strategy of coding for the relay channel, the relay does not attempt to decode the signal from the source, but merely forwards a processed version of its received signal to the destination. According to the compress-forward (CF) subcategory of OF, the relay compresses its received signal and forwards the compressed version to the destination. Existing CF strategies leave a lot to be desired in terms of performance. Thus, there exists a need for new systems and methodologies for performing CF coding for the relay channel.

SUMMARY

At a source system, a message is split up into two portions. The two portions are encoded with two encoders (e.g., LDPC encoders), respectively. The first encoded portion is transmitted in a first interval using N-PSK modulation, where N is an integer greater than or equal to two. A relay system and a destination system listen to this transmission in the first interval. The second encoded portion is transmitted in a second interval using N-PSK modulation. The destination system listens to this transmission in the second interval. The first and second intervals may be intervals in time or intervals in frequency.

The relay system receives a stream $Y_r$ of symbols corresponding the first encoded portion in the first interval, performs nested lattice quantization (NLQ) on the stream $Y_r$ to generate an index block W, and performs joint source-channel encoding on the index block W to determine encoded data $U_r$. The encoded data is transmitted to the destination using N-PSK modulation.

The destination system receives a first stream corresponding to the source system's transmission in the first interval, and also receives a second stream corresponding to a mixture of the source system's transmission in the second interval and the relay system's transmission in the second interval. The destination system uses the first stream and the second stream to generate estimates for the message portions. Note that the first message portion is represented in both the first stream and the second stream.

BRIEF DESCRIPTION OF THE DRAWINGS

The following detailed description makes reference to the accompanying drawings, which are now briefly described.

FIG. 1A illustrates one embodiment of a source encoder system.

FIG. 1B illustrates soft input for iterative decoding of DJSCC as $L_{ch}^{(1)}(y_{d1})$ for the first bit plane. For the second bit plane, since the IRA code rate is approximately 1, there is no need to evaluate the information for iterative decoding.

FIGS. 12A and 12B are tables that present the conditional entropy and the corresponding degree distribution polynomials $\lambda(x)$ and $\rho(x)$ for each bit plane of CF for Gaussian relay channels using nested scalar quantization when (A) d=7 m and (B) d=9 m.

Figure 1B:
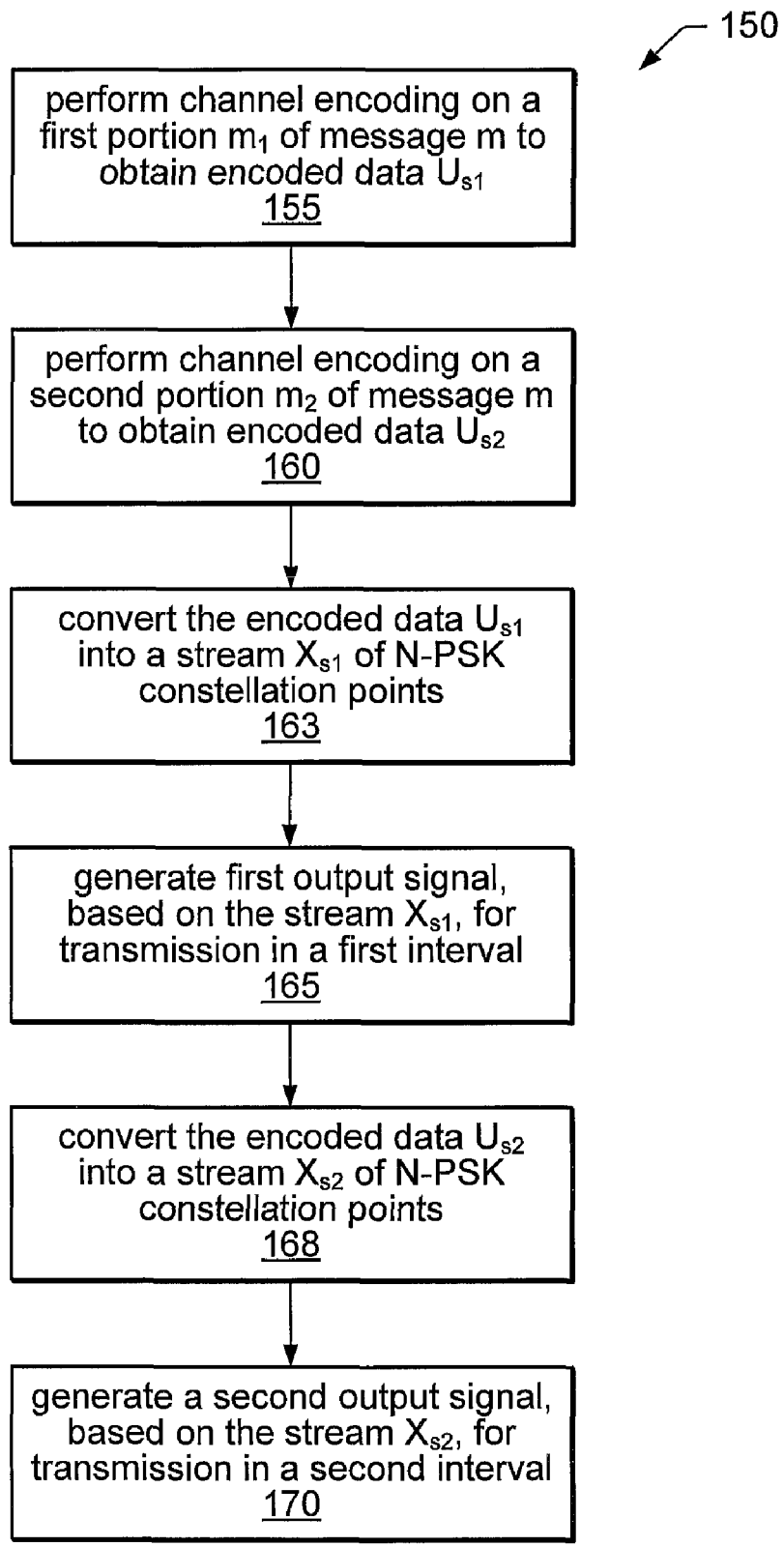
FIG. 1B illustrates one embodiment of a source encoding method.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this specification, the word "may" is used in a permissive sense (i.e., in the sense of "having the potential to"), rather than in the mandatory sense (i.e., in the sense of "must"). Furthermore, the phrase "A includes B" is used to mean "A includes B, but is not limited to B".

DETAILED DESCRIPTION OF THE PREFERRED EMBODIMENTS

Source Encoder System

In one set of embodiments, a source encoder system 100 for encoding a message m may be configured as suggested in FIG. 1A. The source encoder system 100 includes an encoder 105, an encoder 110, a mapping unit 112 and a modulation unit 115. The message m is a block of binary data. The system elements of the source encoder system 100 may be partitioned among one or more hardware devices (e.g., integrated circuits) in any of various ways. The one or more hardware devices may include dedicated circuitry and/or a set of one or more processors controlled by software (i.e., program instructions).

The encoder 105 is configured to perform channel encoding on a first portion $m_1$ of the message m to obtain encoded data $U_{s1}$. The encoder 105 may be a low-density parity check (LDPC) encoder, e.g., an LDPC encoder designed as described in the section below entitled "LDPC Code Design". For more information on LDPC codes, please refer to T. Richardson, M. Shokrollahi, and R. Urbanke, "Design of capacity approaching irregular low-density parity-check codes", IEEE Trans. Inf. Theory, vol. 47, no. 2, pp. 619-637, February 2001, which is hereby incorporated by reference in its entirety. The encoder 105 may be configured to achieve rate $R_r(\alpha)/\alpha$, where $\alpha$ is a real number between zero and one, where $R_r(\alpha)$ satisfies the condition given in expression (7). $R_r(\alpha)$ represents the rate over the channel from the relay to destination.

The encoder 110 is configured to perform channel encoding on a second portion $m_2$ of the message m to obtain encoded data $U_{s2}$. The encoder 110 may be a low-density parity check (LDPC) encoder, e.g., an LDPC encoder designed as described below in the section entitled "LDPC Code Design". The encoder 110 may be configured to achieve rate $R_d(\alpha)/(1-\alpha)$, where $R_d(\alpha)$ represents the transmission rate on the channel from the source to the destination. $R_d(\alpha)$ may be selected to satisfy expression (7B).

The mapping unit 112 is configured to (1) convert the binary values of the encoded data $U_{s1}$ into a stream $X_{s1}$ of points belonging to an N-PSK constellation having power constraint value $P_{s1}$ and (2) convert the binary values of the encoded data $U_{s2}$ into a stream $X_{s2}$ of points belonging to an N-PSK constellation having power constraint value $P_{s2}$, where N is an integer greater than or equal to two. For example, in the case of BPSK (i.e., N=2), the encoded data $U_{s1}$ is converted into a stream $X_{s1}$ of $+A_1$ and $-A_1$ values, where $A_1$ is the square root of the power constraint value $P_{s1}$. Similarly, the encoded data $U_{s2}$ is converted into a stream $X_{s2}$ of $+A_2$ and $-A_2$ values, where $A_2$ is the square root of the power constraint value $P_{s2}$. In the cases where N is greater than two, the N-PSK constellation includes complex values, and thus, the mapping unit 112 may include a pair of output lines in order to output the real and imaginary parts of the complex constellation point.

The modulation unit 115 is configured to generate a first output signal for transmission in a first interval based on the stream $X_{s1}$ and generate a second output signal for transmission in a second interval based on the stream $X_{s2}$. The mapping unit 112 and the modulation unit 115 may be configured to implement N-PSK modulation.

In some embodiments, the first interval and second interval are disjoint intervals in time. Thus, the modulation unit 115 may be configured to (a) modulate an RF carrier signal using the stream $X_{s1}$ in order to generate the first output signal in a first time interval and (b) modulate the RF carrier signal using the stream $X_{s2}$ in order to generate the second output signal in a second time interval. The first output signal may be transmitted in the first time interval and the second output signal may be transmitted in the second time interval.

In other embodiments, the first interval and second interval are disjoint bands of frequency. Thus, the modulation unit 115 may be configured to (a) modulate a first RF carrier signal using the stream $X_{s1}$ in order to generate the first output signal in a first frequency band and (b) modulate a second RF carrier signal using the stream $X_{s2}$ to generate the second output signal in a second frequency band. The transmissions of the first output signal and the second output signal may occur in a time-overlapping fashion (e.g., during the same interval in time).

Source Encoder Method

In one set of embodiments, a method 150 for encoding a message m may involve a number of actions/operations as illustrated in FIG. 1B.

At 155, channel encoding is performed on a first portion $m_1$ of the message m in order to obtain encoded data $U_{s1}$. The channel encoding on the first portion $m_1$ may be performed using a first encoder having a low-density parity check (LDPC) structure. (The term "encoder" is used herein in a sense that is broad enough to encompass an encoder realized in hardware, an encoder realized in software, or an encoder realized as a combination of hardware and software.) The LDPC structure may be designed as described in the section below entitled "LDPC Code Design". The channel encoding may achieve rate $R_r(\alpha)/\alpha$, where $\alpha$ is a real number between zero and one.

At 160, channel encoding is performed on a second portion $m_2$ of the message m in order to obtain encoded data $U_{s2}$. The channel encoding on the second portion $m_2$ may be performed using a second encoder having a low-density parity check (LDPC) structure. The LDPC structure may be designed as described in the section below entitled "LDPC Code Design". The channel encoding may achieve rate $R_d(\alpha)/(1-\alpha)$.

At 163, the encoded data $U_{s1}$ is converted into a stream $X_{s1}$ of points belonging to an N-PSK constellation having power constraint value $P_{s1}$, where N is an integer greater than or equal to two.

At 165, a first output signal is generated, based on the stream $X_{s1}$, for transmission in a first interval. Together, operations 163 and 165 implement N-PSK modulation based on the encoded data $U_{s1}$.

At 168, the encoded data $U_{s2}$ is converted into a stream $X_{s1}$ of points belonging to an N-PSK constellation having power constraint value $P_{s2}$.

At 170, a second output signal is generated, based on the stream $X_{s2}$, for transmission in a second interval. Together, operations 168 and 170 implement N-PSK modulation based on the encoded data $U_{s2}$.

In some embodiments, the first interval and second interval are disjoint intervals in time. Thus, operation 165 may include modulating an RF carrier signal using the stream $X_{s1}$ in order to generate the first output signal in a first time interval, and operation 170 may include modulating the RF carrier signal using the stream $X_{s2}$ in order to generate the second output signal in a second time interval. The first output signal may be transmitted in the first time interval and the second output signal may be transmitted in the second time interval.

In other embodiments, the first interval and second interval are disjoint bands of frequency. Thus, the operation 165 may include modulating a first RF carrier signal using the stream $X_{s1}$ in order to generate the first output signal in a first frequency band, and operation 170 may include modulating a second RF carrier signal using the stream $X_{s2}$ to generate the second output signal in a second frequency band. The transmissions of the first output signal and the second output signal may occur in a time-overlapping fashion (e.g., during the same interval in time).

Relay Encoder System

Figure 2A:
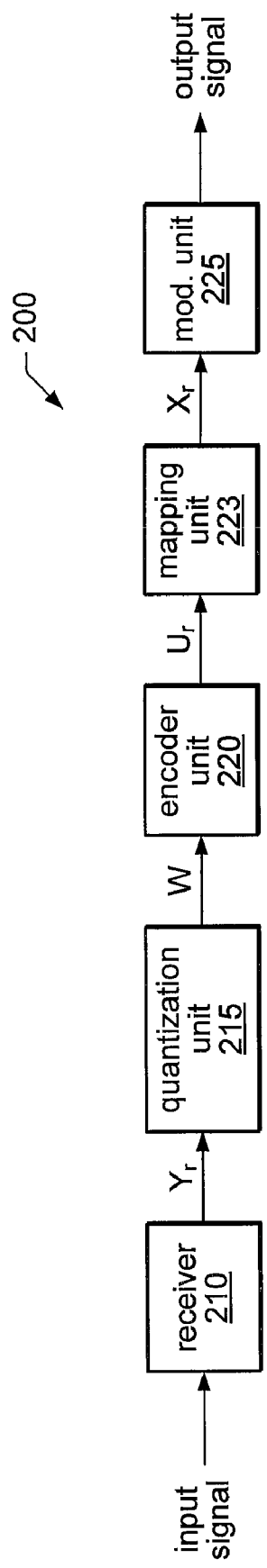
FIG. 2A illustrates one embodiment of a relay system.

In one set of embodiments, a relay system 200 may be configured as suggested in FIG. 2A. The relay system includes a receiver 210, a quantization unit 215, an encoder unit 220, a mapping unit 223 and a modulation unit 225. The system elements of the relay system may be partitioned among one or more hardware devices (e.g., integrated circuits) in any of various ways. The one or more hardware devices may include dedicated circuitry and/or a set of one or more processors controlled by software (i.e., program instructions).

The receiver 210 is configured to receive an input signal from a channel in the first interval and recover input data $Y_r$ from the input signal. The input data $Y_r$ corresponds to the stream $X_{s1}$ (of points from an N-PSK constellation having power constraint value $P_{s1}$) transmitted onto the channel by the source system using N-PSK modulation, where N is greater than one. The receiver 210 may include an N-PSK demodulator.

The quantization unit 215 is configured to perform nested lattice quantization on the input data $Y_r$ to generate a block W of quantization indices. The nested lattice quantization may involve quantization with respect to a coarse lattice and a fine lattice. The coarse lattice may be a sublattice of the fine lattice. For more information on how to perform nested lattice quantization, please refer to the section below entitled "CF Code Design".

The Voronoi volume q (also referred to as step size q in the 1-D case) of the fine lattice may be optimized to minimize the Wyner-Ziv operational distortion-rate function subject to a rate constraint. Please refer to the section below entitled "CF Code Design" for description of the optimization process.

The nesting ratio (i.e., the ratio of coarse lattice Voronoi volume to fine lattice Voronoi volume) may be determined by the WZC rate (conditional entropy of the quantization index) and the distortion, as described in the section below entitled "CF Code Design". WZC is an acronym for Wyner-Ziv coding.

The encoder unit 220 may be configured to perform joint source-channel encoding on the block W to obtain encoded data $U_r$. The encoder unit 220 may be designed as described in the sections below entitled "Distributed Joint Source-Channel Coding (DJSCC) at the Relay" and "CF Code Design".

In some embodiments, the encoder unit 220 may include one or more irregular repeat accumulate (IRA) encoders configured to perform joint source-channel encoding. The encoded data $U_r$ may be the parity bits generated by the one or more IRA encoders.

In one embodiment, the encoder unit 220 includes exactly one IRA encoder. In another embodiment, the encoder unit 220 may include a plurality of IRA encoders configured to perform joint source-channel encoding on corresponding bit planes of the block W, as described in the sections below entitled "Distributed Joint Source-Channel Coding (DJSCC) at the Relay" and "CF Code Design".

The mapping unit 223 may be configured to convert the encoded data $U_r$ into a stream $X_r$ of points belonging to an N-PSK constellation having power constraint value $P_r$. For example, in the case of BPSK (i.e., N=2), the encoded data $U_r$ is converted into a stream $X_r$ of $+A_r$ and $-A_r$ values, where $A_r$ is the square root of the power constraint value $P_r$. In the cases where N is greater than two, the N-PSK constellation includes complex values, and thus, the mapping unit 112 may include a pair of output lines in order to output the real and imaginary parts of the complex constellation point.

The modulation unit 225 may be configured to generate an output signal, for transmission to a destination system in the second interval, based on the stream $X_r$. The modulation unit 225 may generate the output signal by modulating an RF carrier signal using the stream $X_r$. Together, the mapping unit 223 and the modulation unit 225 may be configured to implement N-PSK modulation.

As noted above, the first interval and second interval may be disjoint intervals in time. Alternatively, the first interval and second interval may be disjoint bands of frequency.

Relay Encoder Method

Figure 2B:
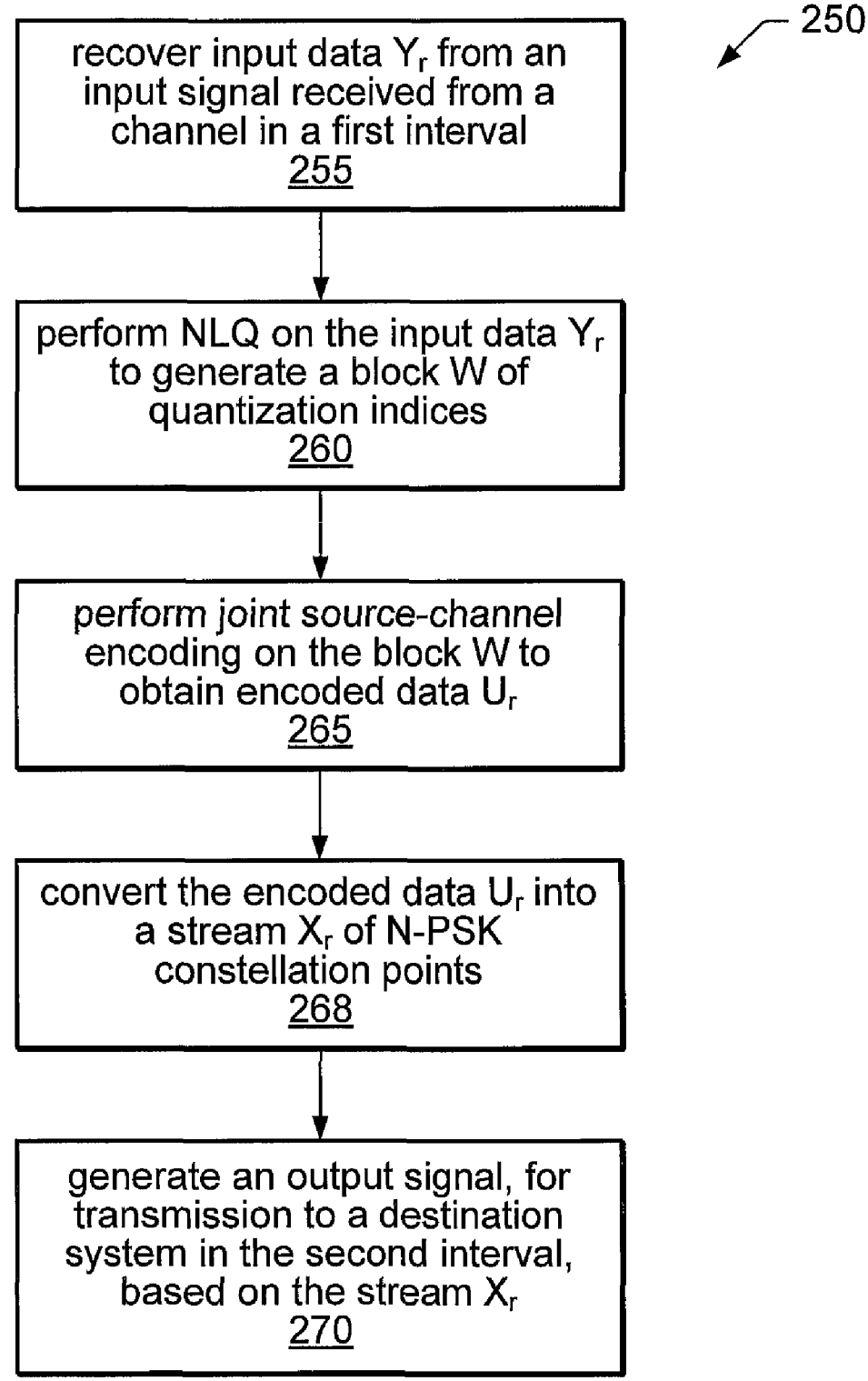
FIG. 2B illustrates one embodiment of compressing information from a source system and forwarding the compressed information to a destination system.

In one set of embodiments, method 250 for relaying data from a source system to a destination system may involve the following actions/operations, as illustrated in FIG. 2B.

At 255, input data $Y_r$ is recovered from an input signal received from a channel in the first interval. The input data $Y_r$ corresponds to the stream $X_{s1}$ (of points from an N-PSK constellation having power constraint value $P_{s1}$) transmitted onto the channel by the source system using N-PSK modulation, where N is greater than one. The reception process may involve performing N-PSK demodulation on an RF signal captured from a receive antenna.

At 260, nested lattice quantization (NLQ) is performed on the input data $Y_r$ to generate a block W of quantization indices. As noted above, the nested lattice quantization may involve quantization with respect to a coarse lattice and a fine lattice. The coarse lattice may be a sublattice of the fine lattice. For more information on how to perform the nested lattice quantization, please refer to the section below entitled "CF Code Design".

The Voronoi volume q of the fine lattice may be optimized to minimize the Wyner-Ziv operational distortion-rate function subject to a rate constraint. The nesting ratio may be determined as described above.

At 265, joint source-channel encoding is performed on the block W to obtain encoded data $U_r$. The joint source-channel encoding may be performed as described in the sections below entitled "Distributed Joint Source-Channel Coding (DJSCC) at the Relay" and "CF Code Design".

In some embodiments, the joint source-channel encoding may be performed using one or more irregular repeat accumulate (IRA) encoders. The encoded data $U_r$ may be the parity bits generated by the one or more IRA encoders.

In one embodiment, the joint source-channel encoding may be performed using exactly one IRA encoder. In another embodiment, the joint source-channel encoding may be performed using a plurality of IRA encoders to encode corresponding bit planes of the block W, as described in the sections below entitled "Distributed Joint Source-Channel Coding (DJSCC) at the Relay" and "CF Code Design".

At 268, the encoded data $U_r$ may be converted into a stream $X_r$ of points belonging to an N-PSK constellation having power constraint value $P_r$.

At 270, an output signal may be generated, for transmission to a destination system in the second interval, based on the stream $X_r$. The output signal may be generated by modulating an RF carrier using the stream $X_r$. Together, operations 268 and 270 may implement an N-PSK modulation.

As noted above, the first interval and second interval may be disjoint intervals in time. Alternatively, the first interval and second interval may be disjoint bands of frequency.

Destination Decoder System

Figure 3:
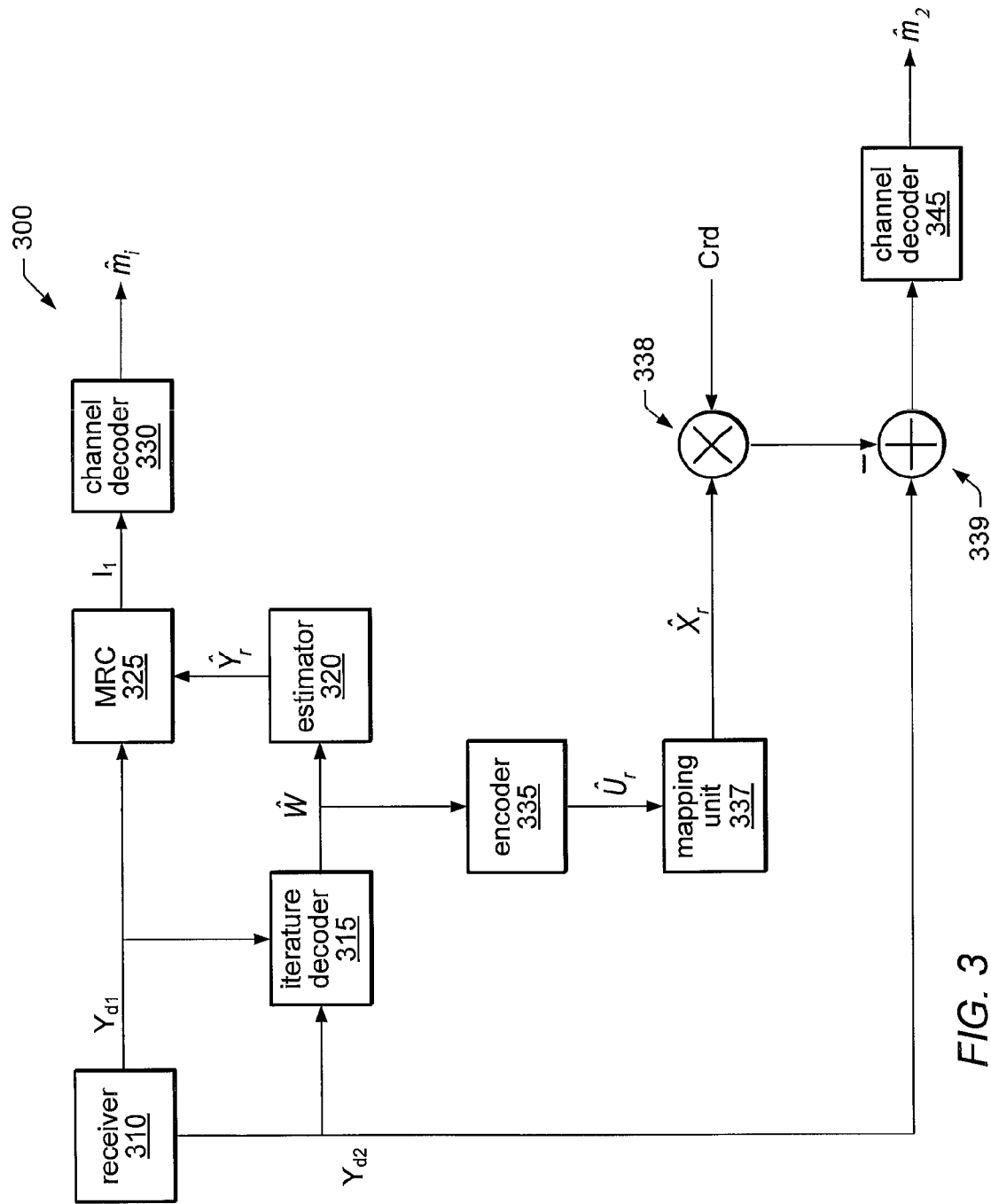
FIG. 3 illustrates one embodiment of a destination decoder system.

In one set of embodiments, a decoder system 300 for recovering a message m based on information received from the source system and information received from the relay system may be configured as illustrated in FIG. 3. The decoder system 300 includes a receiver 310, an iterative decoder 315, an estimator 320, a maximum ratio combining (MRC) unit 325, a channel decoder 330, an encoder unit 335, a mapping unit 337, a scaling unit 338, a difference unit 339 and a channel decoder 345.

The decoder system 300 may be implemented using dedicated circuitry and/or a set of one or more processors controlled by software (i.e., program instructions). The system elements of the decoder system 300 may be partitioned among one or more hardware devices (e.g., integrated circuits) in any of various ways. The one or more hardware devices may include dedicated circuitry and/or a set of one or more processors controlled by software (i.e., program instructions).

The receiver 310 is configured to: recover a stream $Y_{d1}$ of data (e.g., a stream of points in the complex plane) from a first input signal in a first interval, and, recover a stream $Y_{d2}$ of data (e.g., a stream of complex points) from a second input signal in a second interval. N is an integer greater than one. The stream $Y_{d1}$ is a channel-modified version of the stream $X_{s1}$ (of points from an N-PSK constellation having power constraint value $P_{s1}$) transmitted in the first interval by the source system using N-PSK modulation. N is an integer greater than one.

The stream $Y_{d2}$ is a mixture including (a) a channel-modified version of the stream $X_{s2}$ transmitted in the second interval by the source system using N-PSK modulation and (b) a channel-modified version of the stream $X_r$ transmitted in the second interval by the relay system using N-PSK modulation. Recall that the relay system is configured to: receive stream $Y_r$ (which is a channel-modified version of the stream $X_{s1}$ transmitted by the source system); perform nested lattice quantization on the stream $Y_r$ to obtain index block W; perform joint source-channel encoding on the index block W to obtain the encoded data $U_r$; and map the encoded data $U_r$ to the stream $X_r$ of points from an N-PSK constellation having power constraint value $P_r$.

The iterative decoder 315 is configured to generate an estimate for the index block W using the stream $Y_{d1}$ and the stream $Y_{d2}$. The iterative decoder 315 may be configured to perform joint source-channel decoding on the stream $Y_{d2}$ using the stream $Y_{d1}$ as side information. For more information on the design of the iterative decoder 315, please refer to the section below entitled "CF Code Design".

In the process of performing the joint source-channel decoding, the iterative decoder 315 may utilize structure information that represents the structure of the joint source-channel encoder(s) employed by the relay system. This structure information may be stored in the decoder system 300 and accessed by the iterative decoder 315. In an alternative embodiment, the iterative decoder 315 may be realized in terms of dedicated circuitry. In this case, the structure information may be built into the dedicated circuitry.

The estimator 320 is configured to generate an estimate for the stream $Y_r$ using the estimate for the index W. The estimator 320 may be a maximum mean square error estimator. For more information on the design of the estimator 320, please refer to the section below entitled "CF Code Design".

The maximum ratio combining (MRC) unit 325 is configured to compute information $I_1$ based on the stream $Y_{d1}$ and the estimate for the data $Y_r$. The information $I_1$ may be log likelihood ratios for a first portion $m_1$ of message m given $Y_{d1}$ and $Y_r$. For more information on how to perform the maximum ratio combining, please refer to the section below entitled "CF Code Design".

The channel decoder 330 is configured to operate on the information $I_1$ to generate an estimate for message portion $m_1$. The channel decoder 330 may utilize structure information that describes the structure of channel encoder 105 of the source system. Alternatively, the channel decoder 330 may be realized using dedicated circuitry, in which case the structure information may be built into the dedicated circuitry.

The channel decoder 330 may be an iterative decoder and may be designed as described in the section below entitled "CF Code Design".

The encoder unit 335 is configured to perform joint source-channel encoding on the estimate of the index block W to obtain an estimate for the encoded data $U_r$. The joint source-channel encoding performed by the encoder unit 335 may be identical to the joint source-channel encoding performed by the relay system.

The mapping unit 337 is configured to convert the estimate for data $U_r$ into a stream of points from the N-PSK constellation having power constraint $P_r$ in order to generate an estimate $\hat{X}_r$ for the stream $X_r$ generated at the relay system.

The scaling unit 338 is configured to scale the estimate $\hat{X}_r$ by the complex factor $c_{rd}$ to generate the scaled stream $c_{rd}\hat{X}_r$. Thus, scaling unit 338 may be configured to perform complex multiplication.

The difference unit 339 is configured to subtract the scaled stream $c_{rd}\hat{X}_r$ from the stream $Y_{d2}$ in order to obtain a difference stream.

The channel decoder 345 may be configured to operate on the difference stream in order to generate an estimate for message portion $m_2$. The channel decoder 345 may utilize structure information that describes the structure of channel encoder 110 of the source system. Alternatively, the channel decoder 345 may be realized using dedicated circuitry, in which case the structure information may be built into the dedicated circuitry.

The channel decoder 345 may be an iterative decoder and may be designed as described in the section below entitled "CF Code Design".

As noted above, the first interval and second interval may be disjoint intervals in time. Alternatively, the first interval and second interval may be disjoint bands of frequency.

Destination Decoder Method

Figure 4:
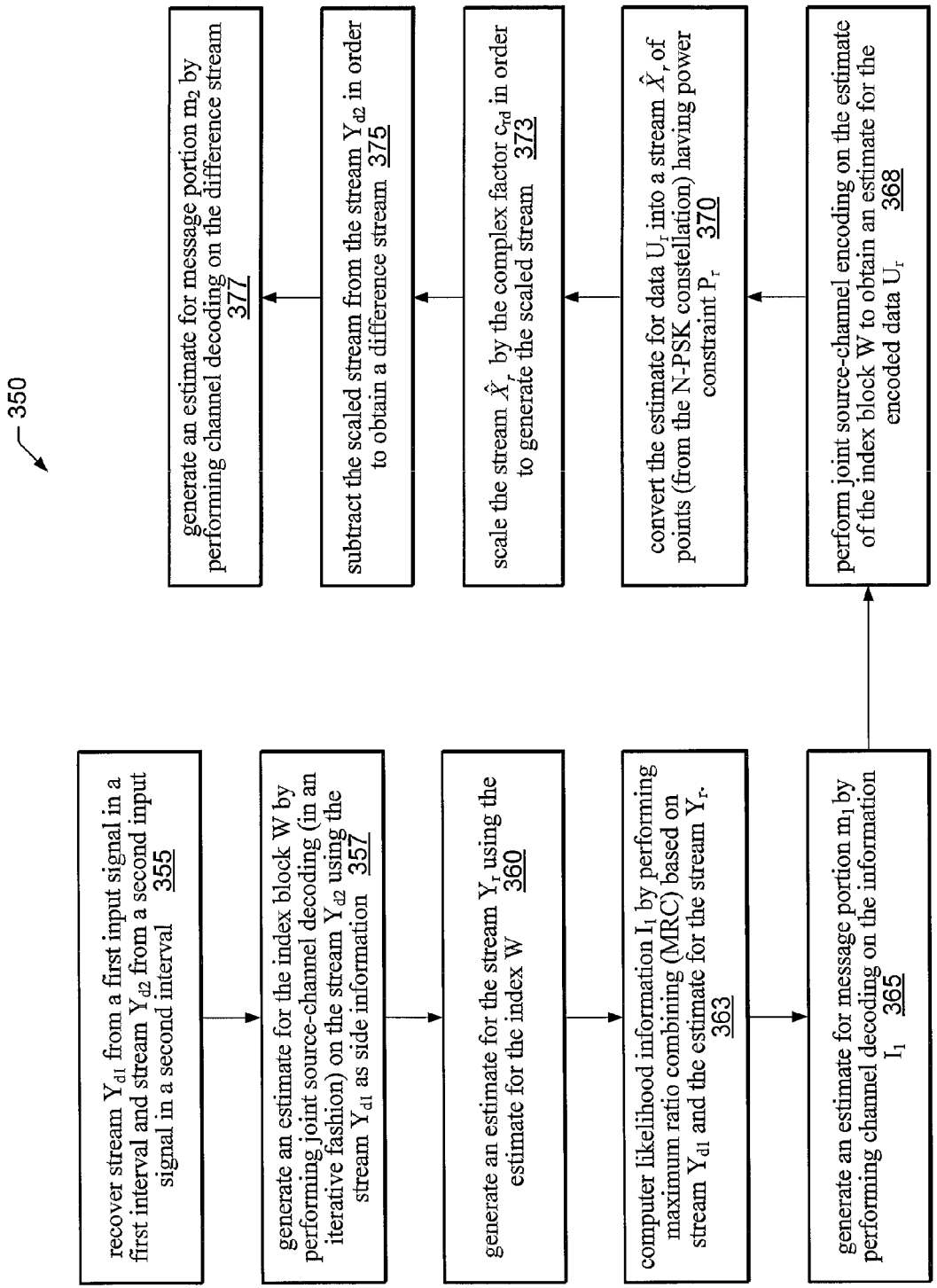
FIG. 4 illustrates one embodiment of a method for recovering message information from signals received from a source system and a relay system.

In one set of embodiments, a decoder method 350 for recovering a message m based on information received from the source system and information received from the relay system may be configured as illustrated in FIG. 4.

At 355, stream $Y_{d1}$ is recovered from a first input signal in a first interval and stream $Y_{d2}$ is recovered from a second input signal in a second interval. The stream $Y_{d1}$ is a channel-modified version of the stream $X_{s1}$ (of points from an N-PSK constellation having power constraint value $P_{s1}$) transmitted in the first interval by the source system using N-PSK modulation. N is an integer greater than one.

The stream $Y_{d2}$ is a mixture including (a) a channel-modified version $V_s$ of the stream $X_{s2}$ transmitted in the second interval by the source system using N-PSK modulation and (b) a channel-modified version $V_r$ of the stream $X_r$ transmitted in the second interval by the relay system using N-PSK modulation. Recall that the relay system is configured to receive stream $Y_r$ (which is a channel-modified version of the stream $X_{s1}$ transmitted by the source system in the first interval), perform nested lattice quantization on the stream $Y_r$ to obtain index block W and to perform joint source-channel encoding on the index block W to obtain the data $U_r$, and then, map the data $U_r$ to the stream $X_r$ of points from an N-PSK constellation having power constraint value $P_r$.

At 357, an estimate for the index block W is generated by performing joint source-channel decoding (in an iterative fashion) on the stream $Y_{d2}$ using the stream $Y_{d1}$ as side information. For more information on the joint source channel decoding, please refer to the section below entitled "CF Code Design". The joint source-channel decoding operation 357 may rely on structure information that represents the structure of the joint source-channel encoder(s) employed by the relay system.

At 360, an estimate for the stream $Y_r$ is generated using the estimate for the index W. The estimate may be generated by performing maximum mean square error estimation. For more information on the estimation 360, please refer to the section below entitled "CF Code Design".

At 363, likelihood information $I_1$ is computed by performing maximum ratio combining (MRC) based on the stream $Y_{d1}$ and the estimate for the data $Y_r$. The likelihood information $I_1$ may be log likelihood ratios for a first portion $m_1$ of message m given $Y_{d1}$ and $Y_r$. For more information on how to perform the maximum ratio combining, please refer to the section below entitled "CF Relaying with BPSK Modulation".

At 365, an estimate for message portion $m_1$ is generated by performing channel decoding on the information $I_1$. The channel decoding may utilize structure information that describes the structure of channel encoder 105 of the source system. The channel decoding may be may be an iterative decoding and may operate as described in the section below entitled "CF Code Design".

At 368, joint source-channel encoding is performed on the estimate of the index block W to obtain an estimate for the encoded data $U_r$. This joint source-channel encoding may be identical to the joint source-channel encoding performed by the relay system.

At 370, the estimate for data $U_r$ is converted into a stream $\hat{X}_r$ of points (from the N-PSK constellation) having power constraint $P_r$. The stream $\hat{X}_r$ is an estimate for the stream $X_r$ generated at the relay system.

At 373, the estimate $\hat{X}_r$ is scaled by the complex factor $c_{rd}$ in order to generate the scaled stream $c_{rd}\hat{X}_r$. This scaling operation involves a complex multiplication.

At 375, the scaled stream $c_{rd}\hat{X}_r$ is subtracted from the stream $Y_{d2}$ in order to obtain a difference stream.

At 377, an estimate for message portion $m_2$ is generated by performing channel decoding on the difference stream. The channel decoding may utilize structure information that describes the structure of channel encoder 110 of the source system. The channel decoding may be an iterative decoding and may operate as described in the section below entitled "CF Code Design".

As noted above, the first interval and second interval may be disjoint intervals in time. Alternatively, the first interval and second interval may be disjoint bands of frequency.

In one set of embodiments, a method for encoding a message m may involve: performing a first low-density parity check (LPDC) channel encoding on a first portion $m_1$ of the message m to obtain first encoded data; performing a second LPDC channel encoding on a second portion $m_2$ of the message m to obtain second encoded data; converting the first encoded data into a first stream of N-PSK constellation points, where N is greater than one; converting the second encoded data into a second stream of N-PSK constellation points; generating a first output signal, for transmission to a relay and a destination in a first interval, based on the first stream on N-PSK constellation points; generating a second output signal, for transmission to the destination in a second interval, based on the second stream of N-PSK constellation points. The first interval and second interval may be disjoint intervals in time. Alternatively, the first interval and second interval may be disjoint bands of frequency.

In another set of embodiments, a method for relaying information from a source system to a destination system may involve: receiving an input signal from a channel in a first interval; recovering from the input signal a stream $Y_r$ of data, where the stream $Y_r$ corresponds to a stream $X_{s1}$ of N-PSK constellation points transmitted onto the channel by a source system using N-PSK modulation, where N is greater than one; performing nested lattice quantization on the stream $Y_r$ to generate a quantization value W; performing joint source-channel encoding on the quantization value W to obtain encoded data; converting the encoded data into a stream $X_r$ of N-PSK constellation points; generating an output signal, for transmission to a destination system in a second interval, based on the stream $X_r$ of N-PSK constellation points. The first interval and second interval may be disjoint intervals in time. Alternatively, the first interval and second interval may be disjoint bands of frequency.

The Voronoi volume q of a fine lattice (or alternatively, the coarse lattice) of the nested lattice quantization may be optimized to minimize a Wyner-Ziv operational distortion-rate function subject to a rate constraint.

The process of performing joint source-channel encoding may include performing an irregular repeat accumulate (IRA) encoding on the quantization value W to obtain the encoded data. Alternatively, the process of performing joint source-channel encoding may include performing a plurality of irregular repeat accumulate (IRA) encodings on corresponding bit planes of the quantization value W to obtain the encoded data.

In yet another set of embodiments, a method for decoding received information in order to recover a message m may involve: receiving a first input signal in a first interval and a second input signal in a second interval; recovering from the first input signal a first stream $Y_{d1}$ of data (e.g., complex points) and from the second input signal a second stream $Y_{d2}$ of data (e.g., complex points), where the first stream $Y_{d1}$ is a first channel-modified version of a stream $X_{s1}$ transmitted in the first interval by a source system using N-PSK modulation, where N is greater than one, where the second stream $Y_{d2}$ is a mixture including a channel-modified version $V_s$ of stream $X_{s2}$ transmitted in the second interval by the source system using N-PSK modulation and a channel-modified version $V_r$ of a stream $X_r$ transmitted in the second interval by a relay system using N-PSK modulation, where the relay system is configured to (a) receive stream $Y_r$ which is a second channel-modified version of the stream $X_{s1}$ transmitted by the source system, (b) perform nested lattice quantization on the stream $Y_r$ to obtain index W and (b) perform joint source-channel encoding on the index W to obtain the stream $X_r$; generating an estimate for the index W using the first stream $Y_{d1}$ and the second stream $Y_{d2}$; generating an estimate for the stream $Y_r$ using the estimate for the index W; performing maximum ratio combining based on the first stream $Y_{d1}$ and the estimate for the stream $Y_r$ in order to obtain likelihood information; performing channel decoding on the likelihood information to generate an estimate for a first portion $m_1$ of the message m.

The first interval and second interval may be disjoint intervals in time. Alternatively, the first interval and second interval may be disjoint bands of frequency.

The method may also include: performing the joint source-channel encoding on the index estimate to obtain an estimate for the stream $X_r$; scaling the estimate for the stream $X_r$ to obtain an estimate for the channel-modified version $V_r$; performing channel decoding on a difference between the second stream $Y_{d2}$ and the estimate of the version $V_r$ to generate an estimate for a second portion $m_2$ of the message m.

In some embodiments, a computer-readable memory medium may be configured to store program instructions, where the program instructions are executable to implement any of the method embodiments described herein (or, any combination of the method embodiments described herein, or, any subset of the method embodiments described herein). A memory medium is a medium configured for the storage of information. Examples of memory media include various kinds of magnetic media (e.g., magnetic tape, magnetic disk, magnetic strips, and magnetic film); various kinds of optical media (e.g., CD-ROM); various kinds of semiconductor RAM and ROM; various media based on the storage of electrical charge and/or other physical quantities; etc.

In some embodiments, a computer system may be configured to include a processor (or a set of processors) and memory medium. The memory medium may be configured to store program instructions. The processor (or set of processors) may be configured to read and execute the program instructions. The program instructions may be executable to implement any of the various method embodiments described herein (or, any combination of the method embodiments described herein, or, any subset of the method embodiments described herein). The computer system may be realized in any of various forms. For example, the computer system may be a personal computer (in any of its various forms), a workstation, a computer on a card, a server computer, a client computer, a computer system in a sensor device, a computer embedded in a transmitter, a computer embedded in a relay system, a computer embedded in a receiver, etc.

The Channel Model

Figure 5:
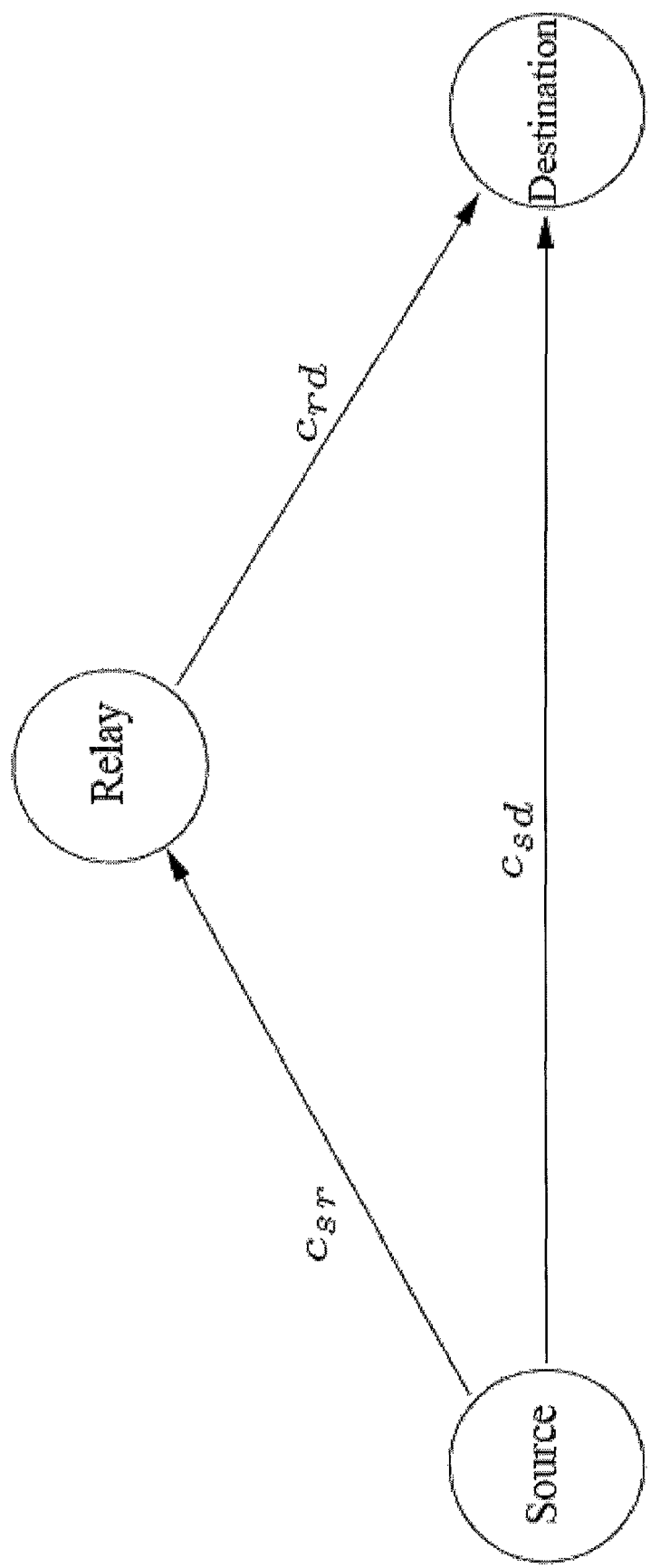
FIG. 5 shows one embodiment of the relay channel with three nodes: the source, the relay and the destination.

A simple three-node relay channel is shown in FIG. 5, where $c_{sd}$, $c_{sr}$, and $c_{rd}$ denote the channel gains/coefficients of the links from the source to destination, source to relay, and relay to destination, respectively. When the channel coefficients are fixed, we have a Gaussian relay channel. In one set of embodiments, we focus on the Gaussian relay channel.

In time-division half-duplex relaying, a frame of length n is divided into two parts: the first block of length nα (0<α<1), and the second block of length n(1−α). The first block forms a codeword $x_{s1}$ to be broadcasted from the source to both the relay and destination under power constraint $P_{s1}$. The relay overhears this transmission, processes its received signal $y_r$ in some way, and transmits the processed version $x_r=f_r(y_r)$ to the destination under power constraint $P_r$. While the relay transmits, the source simultaneously transmits the second block, $x_{s2}$, to the destination under power constraint $P_{s2}$. The codeword $x_{s2}$ is not heard by the relay, as it is in the transmit mode. One way to accomplish this is to split the message m at the source into two non-overlapping parts $m_1$ and $m_2$. Then, $m_1$ is encoded into the nα-length codeword $x_{s1}(m_1)$ as the first block and $m_2$ into the n(1−α)-length codeword $x_{s2}(m_2)$ as the second block. At the frame level, the time interval T is divided into the relay-receive period $T_1$ and the relay-transmit period $T_2$ with $T=T_1+T_2$. During the relay-receive period, the received signals at the relay and the destination are $$y_r[i]=c_{sr}x_{s1}(m_1)[i]+z_r[i], \quad (1)$$

$$y_{d1}[i]=c_{sd}x_{s1}(m_1)[i]+z_{d1}[i], \; i=1,\ldots,n\alpha, \quad (2)$$

respectively, where $z_r$ and $z_{d1}$ are white Gaussian noises with unit power. During the relay-transmit period, the relay and the source, respectively, send the n(1−α)-length codewords $x_r(m_1)$ and $x_{s2}(m_2)$ to the destination, which receives $$y_{d2}[i]=c_{rd}x_r(m_1)[i]+c_{sd}x_{s2}(m_2)[i]+z_{d2}[i], \; i=1,\ldots,n(1-\alpha), \quad (3)$$

where $z_{d2}$ is again white Gaussian noise with unit power.

The upper bound on the capacity and the achievable rates for CF and DF (decompress-forward (DF)) of the relay channel are relatively simple to derive, assuming AWGN channels with Gaussian input (which means that all the signals to be transmitted, namely, $X_{s1}$, $X_{s2}$ and $X_r$, are Gaussian), since the capacity for AWGN channel and the WZC limit for the quadratic Gaussian case are well known. Unfortunately, this Gaussian assumption does not hold with BPSK modulation. Instead, we have binary-input AWGN channels, for which the capacity is $$C(snr) = 1 - \int_{-\infty}^{\infty} \frac{e^{-\tau^2/2}}{\sqrt{s\pi}} \log(1 + e^{-2\sqrt{snr}\,\tau - 2snr}) d\tau. \quad (4)$$

snr is the signal to noise ratio.

Figure 6:
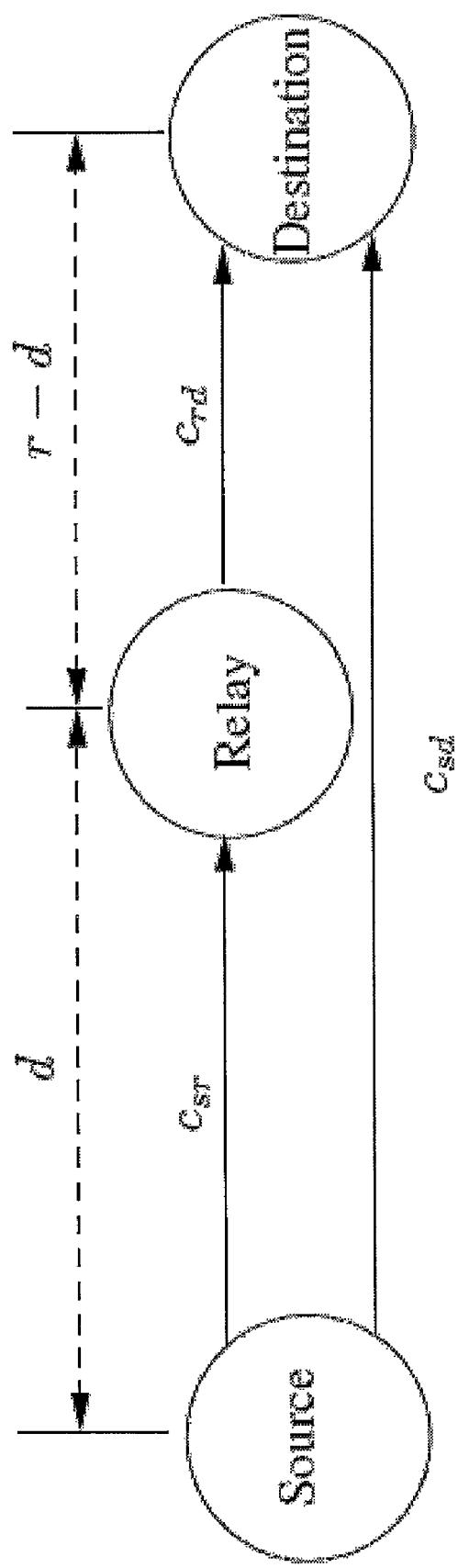
FIG. 6 illustrates one embodiment of the relay channel, where the relay is located along the line between the source and the destination.

In one set of embodiments, we assume the setup shown in FIG. 6 for CF relaying with BPSK modulation (or more generally, N-PSK modulation, where N is greater than one), where the relay is located along a straight line from the source to the destination, which are distance r (e.g., 10 meters) apart. The channel coefficient of the link from sender i to the receiver j (sender i may be the source or relay, and receiver j may be the relay or destination) is $(c_{ij})^2 = K_o(d_{ij})^{-n}$, where $d_{ij}$ is the distance from the sender i to the receiver j, n is the path loss coefficient, $$K_o = (c/4\pi d_o f_c)^2,$$

c is the light speed, $d_o$ is the free-space reference distance, $f_c$ is the transmission frequency. The experimental setup is fixed with $f_c$=2.4 GHz carrier frequency, path loss coefficient n=3, and freespace reference distance $d_o$=1 m. Therefore the channel coefficients are: $(c_{sd})^2=10^{-7}$, $(c_{sr})^2=10^{-4}d^{-3}$, and $(c_{rd})^2=10^{-4}(1-d)^{-3}$. Note that $c_{sd}$ is fixed and $c_{sr}$ and $c_{rd}$ are functions of d. Thus for each particular d, there is a set of the coefficients.

CF Relaying with BPSK Modulation

Figure 7:
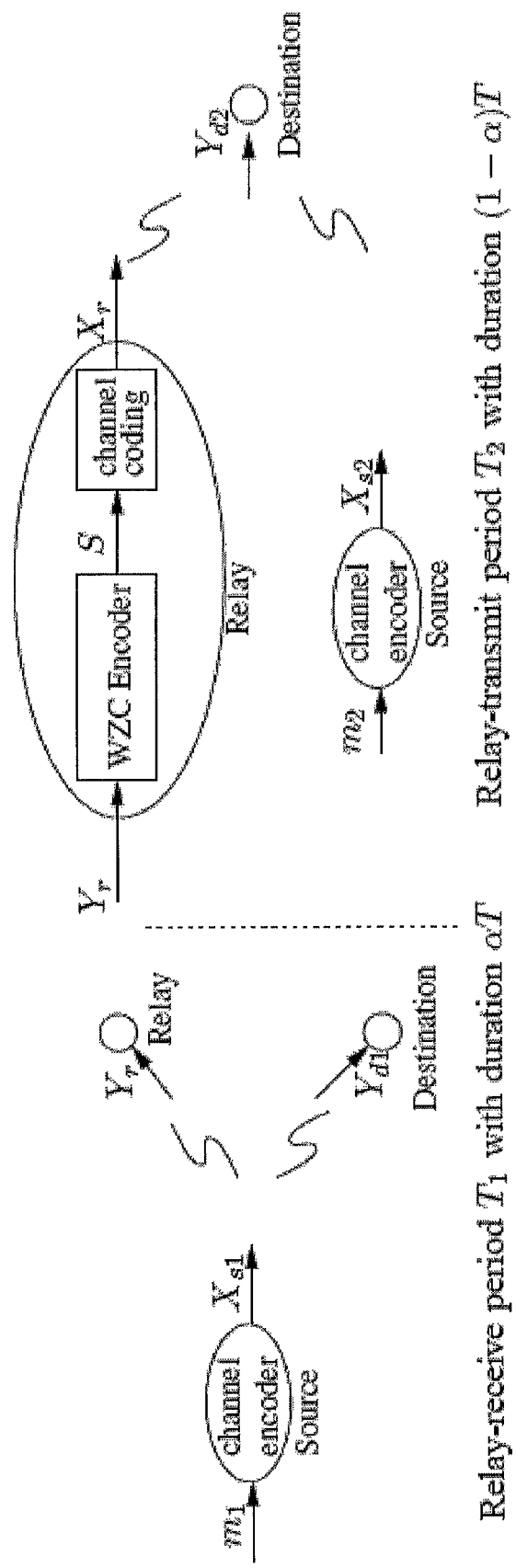
FIG. 7 illustrates one embodiment of the CF coding scheme for half-duplex relaying based on WZC (Wyner-Ziv coding).

FIG. 7 depicts the overall CF coding scheme. During $T_1$, message $m_1$ is channel coded and then BPSK modulated into nα binary symbols $X_{s1}[1], \ldots, X_{s1}[n\alpha]$ with $$\frac{1}{\alpha n}\sum_{i=1}^{\alpha n} X_{s1}[i]^2 \le P_{s1}$$

and broadcasted to the relay and the destination. The received versions are $Y_r=c_{sr}X_{s1}+Z_r$ at the relay, and, $Y_{d1}=c_{sd}X_{s1}+Z_{d1}$ at the destination. We thus have a broadcast channel in the relay-receive period.

During $T_2$, $Y_r$ is compressed into S using Wyner-Ziv encoder by treating $Y_{d1}$ at the destination as the decoder side information. Then, the relay encodes S into binary channel codeword $X_r$ of length (1−α)n with $$\frac{1}{(1-\alpha)n} \sum_{i=1}^{(1-\alpha)n} X_r[i]^2 \le P_r$$

and sends it to the destination. At the same time, the source encodes $m_2$ into $(1-\alpha)n$ binary symbols $X_{s2}[1], \ldots, X_{s2}[(1-\alpha)n]$ with $$\frac{1}{(1-\alpha)n} \sum_{i=1}^{(1-\alpha)n} X_{s2}[i]^2 \le P_{s2}$$

and sends them to the destination as well. The signal received at the destination from the source and relay is $Y_{d2} = c_{rd} X_r + c_{sd} X_{s2} + Z_{d2}$. We hence have a multiple-access channel (MAC) in the relay-receive period.

At the destination, $m_1$ and $m_2$ may be recovered sequentially. First, $Y_r$ is reconstructed into $Y_r'$ via Wyner-Ziv decoding at the destination (with the help of the side information $Y_{d1}$), yielding an average distortion of $D_{WZ}(R)$, where R is the WZC rate. Note that we can write $Y_r' = Y_r + N$, where N is the quantization noise with its variance as the Wyner-Ziv distortion limit $D_{WZ}(R)$, and the corresponding WZC rate R is the capacity of the link between the relay and the destination (with both $c_{sd}X_{s2}$ and $Z_d$ being treated as noise) and given by $$R = \frac{1-\alpha}{\alpha} C\left(\frac{|c_{rd}|^2 P_r}{1 + |c_{sd}|^2 P_{s2}}\right), \quad (5)$$

where the normalization factor $(1-\alpha)/\alpha$ is due to half-duplex relaying.

With both $Y_r' = Y_r + N = c_{sr} X_{s1} + Z_r + N$ and $Y_{d1} = c_{sd} X_{s1} + Z_{d1}$ available at the destination as corrupted versions of $X_{s1}$, we can recover $m_1$ with the information provided by $Y_r'$ and $Y_{d1}$ jointly. The joint log-likelihood-ratio (LLR) is $$L_{ch}(m_1|y_r', y_{d1}) = \log\left(\frac{f(m_1 = 0|y_r', y_{d1})}{f(m_1 = 1|y_r', y_{d1})}\right) \quad (6)$$

$$= \log\left(\frac{f(y_r', y_{d1}|m_1 = 0)P(m_1 = 0)}{f(y_r', y_{d1}|m_1 = 1)P(m_1 = 1)}\right)$$

$$= -2\sqrt{P_{s1}}\left(\frac{c_{sr}}{1 + D_{WZ}(R)} y_r' + c_{sd} y_{d1}\right) +$$

$$\log\frac{P(m_1 = 0)}{P(m_1 = 1)}$$

$$= -2\tilde{y} + \log\frac{P(m_1 = 0)}{P(m_1 = 1)},$$

where $$\tilde{y} = \frac{c_{sr}\sqrt{P_{s1}}}{1 + D_{WZ}(R)} y_r' + c_{sd}\sqrt{P_{s1}} \, y_{d1}.$$

Assume $P(m_1=0)=P(m_1=1)=0.5$, then $$L_{ch}(m_1|y_r', y_{d1}) = -2\tilde{y}$$

which is the LLR from the AWGN channel with channel output $\tilde{Y}$ and unit noise variance. Therefore this LLR is equivalent to the LLR of the combination of $y_{d1}$ and $y_r'$ with the same coefficients as maximum ratio combining (MRC).

(For more information on maximum ratio combining, please refer to: Andear Goldsmith, Wireless Communications, Cambridge University Press, Aug. 8, 2005, on page 214-216.) Then we can decode $m_1$ using joint decoding similar to MRC with rate $$R_r(\alpha) \le \alpha C\left(|c_{sd}|^2 P_{s1} + \frac{|c_{sr}|^2 P_{s1}}{1 + D_{WZ}(R)}\right). \quad (7)$$

Once $m_1$ is recovered, $X_r$ can be reconstructed and $c_{rd}X_r$ eliminated from $Y_{d2} \, c_{rd}X_r + c_{sd}X_{s2} + Z_{d2}$. Then, $m_2$ can be decoded with rate $$R_d(\alpha) = (1-\alpha)C(|c_{sd}|^2 P_{s2}). \quad (7B)$$

Consequently, the overall achievable rate of CF for the half-duplex relay channel with specific $\alpha$ is $$R_{CF}(\alpha) = R_r(\alpha) + R_d(\alpha) \quad (8)$$

$$\le \alpha C\left(|c_{sd}|^2 P_{s1} + \frac{|c_{sr}|^2 P_{s1}}{1 + D_{WZ}(R)}\right) +$$

$$(1-\alpha)C(|c_{sd}|^2 P_{s2}).$$

Therefore, the bound for the achievable rate with CF can be written as $$R_{CF} \le \max_{0 \le \alpha \le 1} R_{CF}(\alpha) \quad (9)$$

$$\le \max_{0 \le \alpha \le 1}\left(\alpha C\left(|c_{sd}|^2 P_{s1} + \frac{|c_{sr}|^2 P_{s1}}{1 + D_{WZ}(R)}\right) +\right.$$

$$\left.(1-\alpha)C(|c_{sd}|^2 P_{s2})\right).$$

Note that the above achievable rate is given under the transmitting power constraints $P_{s1}$, $P_{s2}$, and $P_r$. We now consider the rates under the average power constraints $P_s$ and $P_r$.

Since the relay only transmits during the relay-transmit period $T_2$ with block length $n(1-\alpha)$, the normalized transmitting power at the relay is $P_r/(1-\alpha)$. Similarly, the normalized transmitting power at the source during the relay-receive period $T_1$ and the relay-transmit period $T_2$ is $P_{s1}=kP_s/\alpha$ and $P_{s2}=(1-k)P_s/(1-\alpha)$, respectively, where k ($0 \le k \le 1$) and $\alpha$ determine the power allocation at the transmitter.

For the relay channel with BPSK modulation, the signals $Y_r$ and $Y_d$, are given by (1) and (2), and $X_{s1}$ is a BPSK-modulated signal, taking values at $\sqrt{P_{s1}}$ and $-\sqrt{P_{s1}}$ with the probabilities p and 1-p, respectively. $Z_r$ and $Z_d$ are i.i.d. Gaussian noise with zero mean and unit variance. Without loss of generality, we assume p=0.5. Because $$Y_r \leftrightarrow X_{s1} \leftrightarrow Y_{d1}$$

forms a Markov chain, the conditional pdf $f(y_r|y_{d1})$ is $$f(y_r|y_{d1}) = \zeta \frac{1}{\sqrt{2\pi}} \exp\left(-\frac{(y_r - c_{sr}\sqrt{P_{s1}})^2}{2}\right) + \quad (10)$$

$$(1-\zeta)\frac{1}{\sqrt{2\pi}} \exp\left(-\frac{(y_r - c_{sr}\sqrt{P_{s1}})^2}{2}\right),$$

where $$\zeta = \frac{1}{1+\exp(-2c_{sd}\sqrt{P_{s1}}\,y_{d1})}.$$

Figure 8:
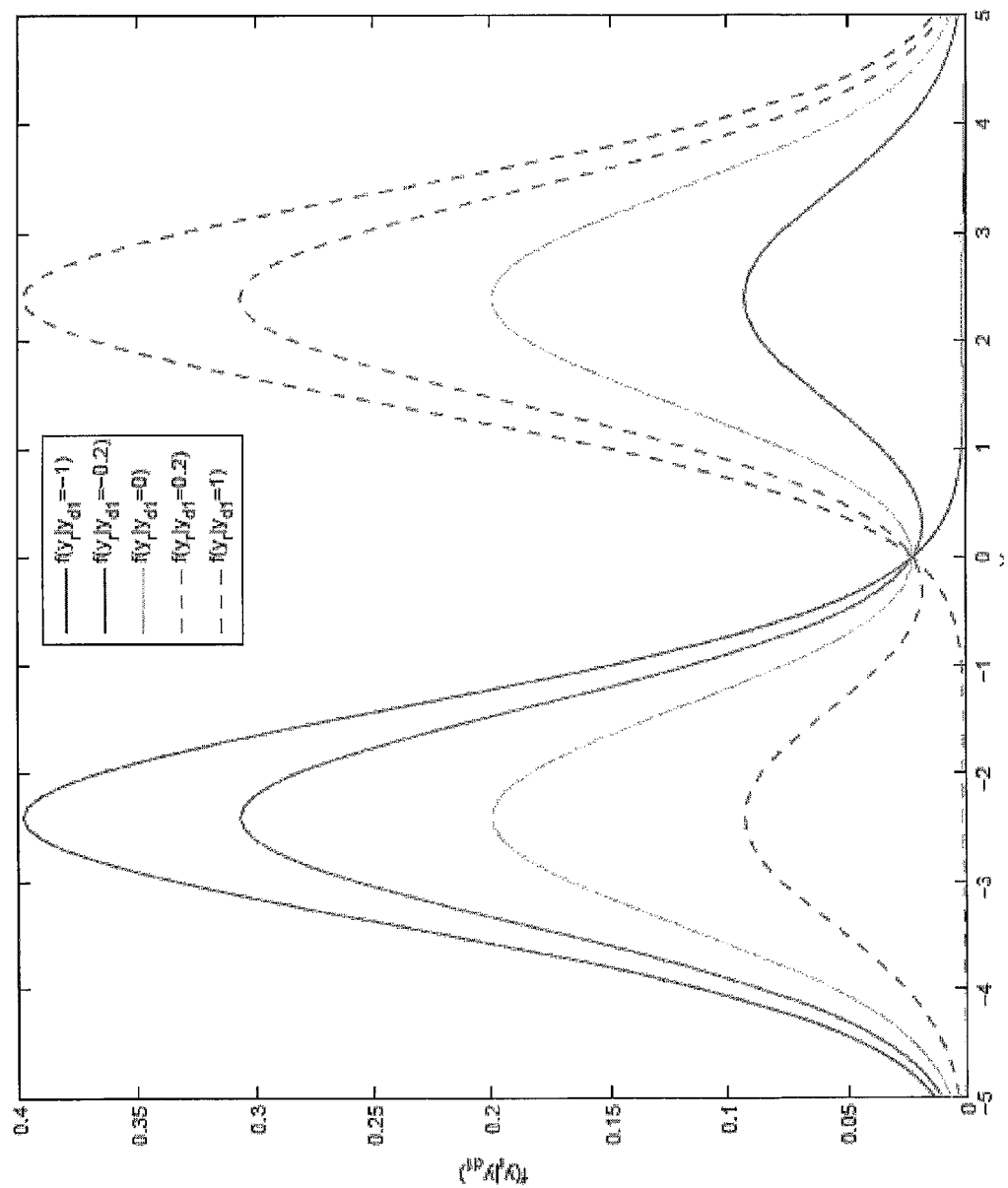
FIG. 8 shown an example of the conditional distribution of $Y_r$ given particular values of $Y_{d1}$, with d=9 m.

It is seen from (10) that the conditional probability of $Y_r$ given $Y_{d1}$ is the weighted superposition (mixture) of two Gaussian distributions centered at $c_{sr}\sqrt{P_{s1}}$ and $-c_{sr}\sqrt{P_{s1}}$, respectively, with the identical unit variance. The weights rely on the likelihood of $x_{s1}$ providing $y_{d1}$. Several examples of $f(y_r|y_{d1})$ with specific values of $y_{d1}$ at d=9 m. are shown in FIG. 8 to provide an intuitive view.

Distributed Joint Source-Channel Coding (DJSCC) at the Relay

For Slepian-Wolf Coded Nested Quantization (SWC-NQ) as practical WZC for CF relaying, since Slepian Wolf coding (SWC) is implemented by channel codes, separate source-channel coding at the relay (with side information $Y_{d1}$, at the destination) requires two channel codes: one for SWC (or source coding) and another for forward error protection (or channel coding). However, just like Shannon's classic separation principle, the separation principle for the noisy channel SWC/WZC problem only holds asymptotically (i.e., with infinite code length). In practical designs with finite code length, joint source-channel coding with side information (or DJSCC) should outperform a separate design.

The basic idea of DJSCC is to use one channel code for both Slepian-Wolf compression and forward error protection. This is possible because a) in addition to the optimal syndrome-based approach for SWC, parity bits of a systematic channel code can also be used for SWC, and b) if the number of parity bits exceeds the Slepian-Wolf limit, the added redundancy can be exploited for protection. In the following, we briefly explain the so-called parity-based approach for SWC before moving on to parity-based DJSCC.

The parity-based SWC scheme for binary i.i.d. sources employs an (n+r, n) linear systematic channel code. To compress an n-bit vector from the source X, the encoder outputs r parity bits of the underlying systematic channel code as its compressed version, meaning r≦n. In addition, r≧nH(X|Y) by the Slepian-Wolf theorem. (For information on the Slepian-Wolf theorem, please refer to D. Slepian and J. Wolf, "Noiseless coding of correlated information sources," IEEE Trans. Inform. Theory, vol. 19, pp. 471-480, July 1973.) Thus the rate n/(n+r) of the employed systematic channel code must be no greater than 1/(1+H(X|Y)), which is no less than ½. The decoder concatenates the r parity bits and the corresponding n side information bits from Y to form the received (n+r)-bit codeword before attempting to reconstruct its original n-bit systematic part as the decoded source vector.

When r=n−k, the (2n−k, n) systematic channel code in the above parity-based SWC scheme can be designed to give the same performance as the syndrome-based SWC scheme, which outputs n−k syndrome bits of an (n, k) binary channel code for the "virtual" correlation channel between the two correlated sources X and Y. The syndrome-based approach is optimal in the sense that if the (n, k) binary channel code approaches the capacity of the "virtual" correlation channel, it also provides limit-approaching performance in SWC.

Although a longer (2n−k, n) code is needed in the parity-based approach to obtain the same SWC performance as an (n, k) code in the syndrome-based approach—the reason why the latter is preferred for SWC, the advantage of the former lies in the ease with its generalization to DJSCC. On the other hand, it is not clear if the latter can be extended to DJSCC. This is because in contrast to parity bits, syndrome bits cannot provide error protection.

Under the same encoding/decoding structure that employs an (n+r, n) linear systematic channel code for parity-based SWC, the extension to parity-based DJSCC involves two steps. First, because the r parity bits generated by the encoder now provides joint Slepian-Wolf compression and error protection, r is not upper bounded by n any more. In addition, r≧nH(X|Y)/C. Since the capacity C≦1, the encoder generally outputs more parity bits than the Slepian-Wolf limit. It is this added redundancy that provides error protection. Second, because we are using one channel code in DJSCC to do two jobs (SWC and error protection), the code design now involves two channels: one is the "virtual" correlation channel between the correlated sources; another is the physical noisy channel through which the parity bits are transmitted. Finding the right class of linear systematic code whose design process can readily accommodate two such channels is the starting point of DJSCC.

Figure 9:
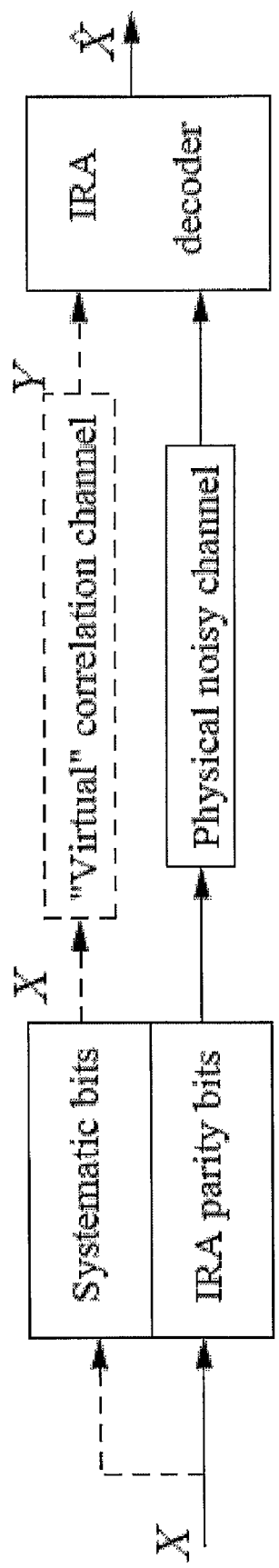
FIG. 9 illustrates the distributed joint source-channel coding (DJSCC) of binary source X with decoder side information Y using systematic IRA codes that are designed for both the physical noisy channel and the "virtual" correlation channel between X and Y.

Liveris et al. (Liveris, Xiong, and Georghiades, "Joint source-channel coding of binary sources with side information at the decoder using IRA codes", in Proc. MMSP-2002, St. Thomas, US Virgin Islands, December 2002) employ systematic IRA codes for DJSCC of binary source X with decoder side information Y. The basic idea of Liveris et al. is depicted in FIG. 9, where the distributed joint source-channel (DJSC) encoder only generates IRA parity bits for transmission over the noisy channel, and the already existing side information Y at the decoder is viewed as a "noisy" version of the source X (or systematic part); the IRA/DJSC decoder combines Y and the received noisy parity bits to reconstruct $\hat{X}$.

IRA codes (introduced in Jin, Khandekar and McEliece, "Irregular repeat-accumulate codes," in Proc. 2nd Int. Symp. Turbo codes and related topics, September 2000) can perform close to capacity on the binary-input AWGN channel. In addition, systematic IRA codes have the advantages of both LDPC codes (with iterative decoding) and turbo codes (with linear-time encoding). They are well suited for DJSCC because they can be designed using Gaussian approximation to take into account the two different channels.

CF Code Design

A. Quantizer Design

Nested scalar quantizer design for $Y_r$ targets at finding the optimal nesting ratio N and scalar quantization stepsize q to minimize the distortion while subjecting to the rate constraint $$R \leq \frac{1-\alpha}{\alpha}C_{rd}, \tag{36}$$

where the rate $R=H(W|Y_{d1})$ due to Slepian-Wolf coding of the nested quantization index W and $c_{rd}$ is the capacity of the channel between the relay and the destination with BPSK modulation. Due to BPSK modulation, NSQ has to operate at the low rate. We hence resort to simulations to generate the operational distortion-rate function $\hat{D}_{WZ}(R)$ of SWC-NSQ by varying N and q. Based on $\hat{D}_{WZ}(R)$, the operational point at R that is slightly less than the target rate $(1-\alpha)/(\alpha C_{rd})$ is picked and its corresponding N and q identified as the optimal parameters for NSQ.

Figure 10:
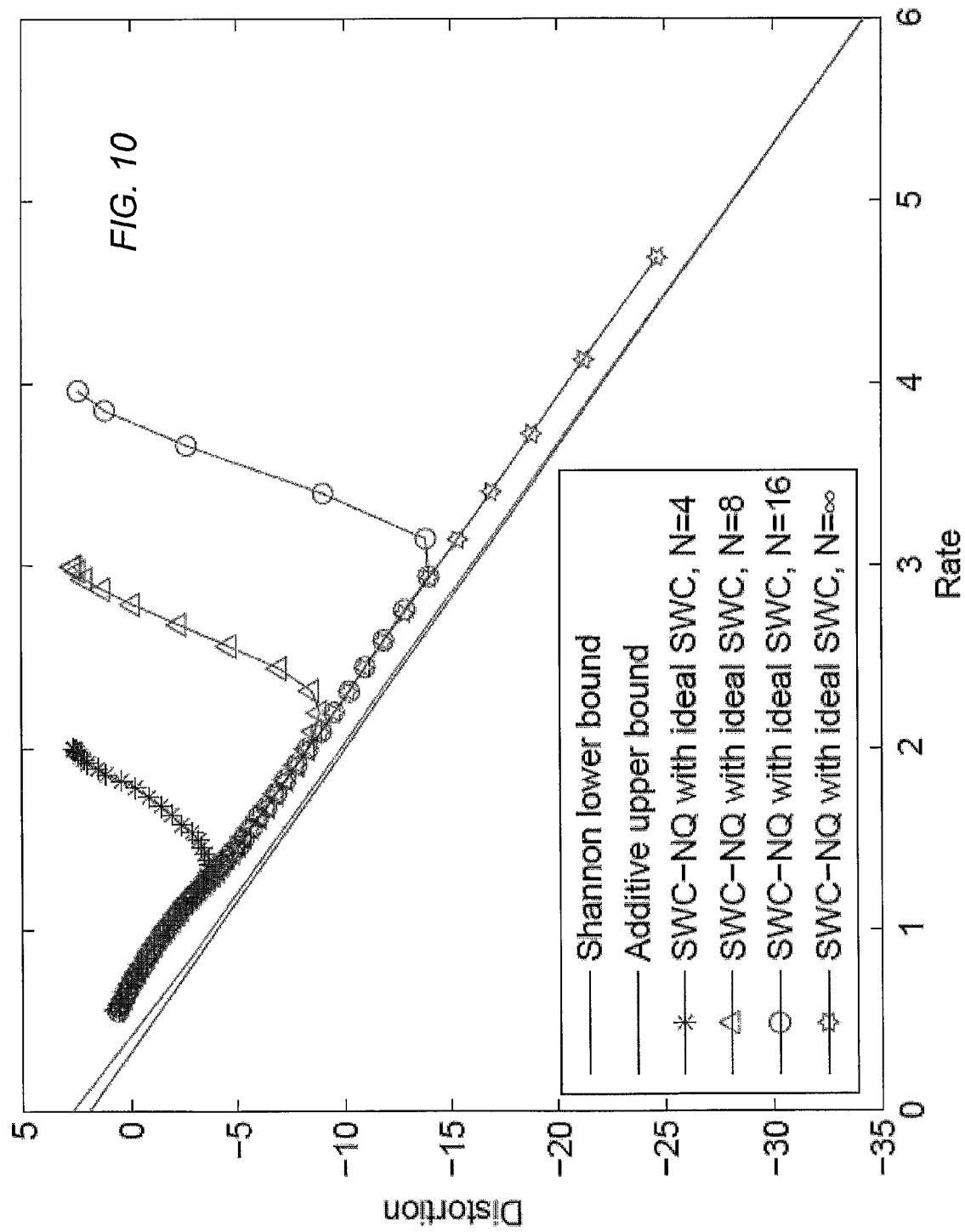
FIG. 10 shows operational distortion-rate curves of SWC-NSQ (assuming ideal SWC after NSQ) of $Y_r$ with decoder side information $Y_{d1}$ for several different nesting ratios N, where each curve is generated by varying the quantization stepsize q while fixing N. The lower envelope of these curves is the operational distortion-rate function of SWC-NSQ. The relay is 9 m away from the source, and $|c_{sd}|^2=0.85|c_{sr}|^2$.

We draw L (e.g., $10^5$) samples of $Y_r'$ and $Y_{d1}'$ offline (here we use $Y_r'$ and $Y_{d1}'$ to distinguish them from $Y_r$ and $Y_{d1}$ because $Y_{d1}$ is not available at the relay) according to the joint distribution of $Y_r$ and $Y_{d1}$, quantize $Y_r'$ into $W'$, decode $\hat{Y}_r'$ jointly from $W'$ and $Y_{d1}$, and compute the corresponding rate $R'=H(W'|Y_{d1}')$ and distortion $$D'_{WZ}(R') = \frac{1}{L}\sum_{i=1}^{L}|Y_r^i[i] - \hat{Y}_r^i[i]|^2$$

with different N and q. For $$|c_{sr}|^2=1, |c_{sd}|^2=0.5,$$

and $P_{s1}=10$, FIG. 10 shows the distortion-rate curves for several different nesting ratios N, where each curve is generated by varying q while fixing N. The lower envelope of these curves is the operational distortion-rate function $\tilde{D}_{WZ}(R)$ of SWC-NSQ, which is 1.5 dB away from the upper bound $D_{WZ}^{add}(R)$ at high rate.

When reconstructing $W'$ into $\hat{Y}_r'$, non-linear estimation may be applied to reduce the distortion, especially at low rate. Denote $J(W')$ as the index of $W'$, $0<J<N-1$, then the $\hat{Y}_r'$ is reconstructed into $$\hat{Y}_r' = \frac{\sum_k \int_{(kN+J(W'))q}^{(kN+J(W')+1)q} y_r f(y_r|y_{d1}) dy_r}{\sum_k \int_{(kN+J(W'))q}^{(kN+J(W')+1)q} f(y_r|y_{d1}) dy_r}, \quad (37)$$

where $f(y_r|y_{d1})$ is given by (10). For more information regarding non-linear estimation, please refer to: (a) Liu et al., "Slepian-Wolf coded nested quantization for Wyner-Ziv coding: High-rate performance analysis and code design", IEEE Trans. Inform. Theory, vol. 52, October 2006, and (b) U.S. patent application Ser. No. 11/086,778, filed on Mar. 22, 2005, entitled "Data Encoding and Decoding Using Slepian-Wolf Coded Nested Quantization to Achieve Wyner-Ziv Coding", invented by Liu, Cheng, Liveris and Xiong which are hereby incorporated by reference in their entirety.

B. DJSCC Based on IRA Codes

When the nesting ratio $N=2$ in NSQ, using a binary systematic $(n, n\alpha)$ IRA code of rate $\alpha$, we apply parity-based DJSCC at the relay and encode the binary quantization index W (of length $n\alpha$) into parity bits $X_r$ of length $n(1-\alpha)$ for transmission to the destination. The destination receives $Y_{d2}=c_{rd}X_r+c_{sd}X_{s2}+Z_d$ where $c_{sd}X_{s2}+Z_d$ is treated as the additive noise. Meanwhile, the side information $Y_{d1}$ at the destination plays the role of the "noisy" systematic part of the IRA codeword. Then W is decoded from $[Y_{d1}, Y_{d2}]$ by the IRA/DJSC decoder, resulting in $\hat{W}$. Since in the optimal NSQ design, we pick its rate such that $$R = H(W|Y_{d1}) < \frac{1-\alpha}{\alpha} C_{rd}, \quad (38)$$

we have $$n(1-\alpha) > \frac{n\alpha H(W|Y_{d1})}{C_{rd}}, \quad (39)$$

in DJSCC, which fulfills the requirement for successful decoding of W.

When $N>2$ in NSQ, we employ a multi-level systematic IRA code for DJSCC, where each of the $\lceil \log N \rceil$ levels is used for one bit plane of W. Denote $J$ ($0 \leq J \leq N-1$) as the index of W and write J as $$B_{\lceil \log N \rceil}, \ldots, B_1$$

in its binary representation, where $B_1$ is the least significant bit of W and $B_{\lceil \log N \rceil}$ its most significant bit. The first-level binary systematic $(n\alpha+r_1, n\alpha)$ IRA code with $$r_1 > \frac{n\alpha H(B_1|Y_{d1})}{C_{rd}} \quad (40)$$

outputs $r_1$ parity bits after DJSCC of $B_1$, and the j-th level $(2 \leq j \leq \lceil \log N \rceil)$ binary systematic $(n\alpha+r_j, n\alpha)$ IRA code with $$r_j > \frac{n\alpha H(B_j|Y_{d1}, B_{j-1}, \ldots, B_1)}{C_{rd}} \quad (41)$$

outputs $r_j$ parity bits after DJSCC of $B_j$. In addition, the $r_j$'s are chosen so that $$\sum_{j=1}^{\lceil \log N \rceil} r_j = n(1-\alpha). \quad (42)$$

By the chain rule, $$\sum_{j=1}^{\lceil \log N \rceil} H(B_j|Y_{d1}, B_{j-1}, \ldots, B_1) = H(W|Y_{d1}), \quad (43)$$

then (40)-(43) lead to $$n(1-\alpha) = \sum_{j=1}^{\lceil \log N \rceil} r_j > \frac{n\alpha H(W|Y_{d1})}{C_{rd}}, \quad (44)$$

which is again guaranteed by our choice of rate in (38) for NSQ.

RATE COMPUTATION FOR EACH BIT PLANE: From (40) and (41), we see that knowing the "sum-rate" $H(W|Y_{d1})$ after NSQ is not enough for multi-level IRA code design in DJSCC, the conditional entropy of each bit plane of W is also needed. We start from estimate $$P_r(B_1=b_1, \ldots, B_j=b_j|Y_{d1}=y_{d1}),$$

where $b_1, \ldots, b_j, y_{d1}$, are specific realizations of $B_1, \ldots, B_j, Y_{d1}$, respectively. Since $B_j$ is determined by $Y_r$, we denote $B_j=b_j(Y_r)$ as a function of $Y_r$. Therefore we have $$P_r(B_1=b_1, \ldots, B_j=b_j|Y_{d1}=y_{d1}) \quad (45)$$
$$= \int_{b_1(y_r)=b_1, \ldots, b_j(y_r)=b_j} f(y_r|y_{d1}) dy_r.$$

When NSQ is applied for quantization, the integration region $$\{y_r | b_1(y_r) = b_1, \ldots, b_j(y_r) = b_j\}$$

is a union of an infinite number of disjoint intervals, and (45) can be calculated analytically using the erfc function. Since $f(y_r|y_{d1})$ decays exponentially from the origin, the sum up of a few Gaussian tail probabilities could be a good approximation of (45).

For the general quantization such as non-uniform quantization or high-dimensional quantization, however, $$P_r(B_1 = b_1, \ldots, B_j = b_j | Y_{d1} = y_{d1})$$

cannot be calculated analytically. Instead, we use Monte Carlo simulations. At first, the real axis is divided into M intervals, partitioning all possible $Y_{d1}$ into M regions $\mathbb{Y}_m$ for $m = 1, \ldots, M$. Denote $\mathbb{Y}(y_{d1})$ as the region containing $y_{d1}$, and define I(*) as the indicator function taking value one if its argument is true, or zero otherwise. We then calculate $P_r(B_1 = b_1, \ldots, B_j = b_j | Y_{d1} = y_{d1})$ offline again by relying on the same L samples of $(Y_r', Y_{d1}')$ we collect during the optimal NSQ design that results in $$P_r(B_1 = b_1, \ldots, B_j = b_j | Y_{d1} = y_{d1}) \quad (46)$$
$$\approx P_r(B_1 = b_1, \ldots, B_j = b_j | Y_{d1} \in \mathbb{Y}(y_{d1}))$$
$$\approx \frac{\sum_{i=1}^{L} I(Y'_{d1}[i] \in \mathbb{Y}(y_{d1}), b_1(Y'_r[i]) = b_1, \ldots, b_j(Y'_r[i]) = b_j)}{\sum_{i=1}^{L} I(Y'_{d1}[i] \in \mathbb{Y}(y_{d1}))}.$$

Based on (46), the j-th level ($1 \leq j \leq \lceil \log N \rceil$) binary systematic ($n\alpha + r_j$, $n\alpha$) IRA code can be designed with $$r_j > \frac{n\alpha}{C_{rd}} H(B_j | Y_{d1}, B_{j-1}, \ldots, B_1) = \quad (47)$$
$$\frac{n\alpha}{C_{rd}} \sum_{m=1}^{M} \sum_{\substack{b_1 \in \{0,1\}, \ldots, \\ b_{j-i} \in \{0,1\}}} P_r(Y_{d1} \in \mathbb{Y}_m, B_1 = b_1, \ldots, B_{j-1} = b_{j-1})$$
$$\mathcal{H}(P_r(B_j = 1 | Y_{d1} \in Y_m, B_1 = b_1, \ldots, B_{j-1} = b_{j-1})) =$$
$$\frac{n\alpha}{C_{rd}} \sum_{m=1}^{M} \sum_{\substack{b_1 \in \{0,1\}, \ldots, \\ b_{j-i} \in \{0,1\}}} P_r(Y_{d1} \in \mathbb{Y}_m, B_1 = b_1, \ldots, B_{j-1} = b_{j-1})$$
$$\mathcal{H}\left(\frac{P_r(B_1 = b_1, \ldots, B_j = 1 | Y_{d1} \in \mathbb{Y}_m)}{P_r(B_1 = b_1, \ldots, B_{j-1} = b_{j-1} | Y_{d1} \in \mathbb{Y}_m)}\right)$$

where $$P_r(B_1 = b_1, \ldots, B_j = 1 | Y_{d1} \in \mathbb{Y}_m)$$

and $$P_r(Y_{d1} \in \mathbb{Y}_m, B_1 = b_1, \ldots, B_{j-1} = b_{j-1})$$

are obtained directly from (46), $$\mathcal{H}(p) = p \log \frac{1}{p} + (1-p) \log \frac{1}{1-p}, \text{ and}$$
$$P_r(Y_{d1} \in \mathbb{Y}_m, B_1 = b_1, \ldots, B_{j-1} = b_{j-1})$$

is estimated by using similar Monte Carlo simulations as (46) with $$P_r(Y_{d1} \in \mathbb{Y}_m, B_1 = b_1, \ldots, B_{j-1} = b_{j-1}) \quad (48)$$
$$= \frac{1}{L} \sum_{i=1}^{L} I(Y'_{d1}[i] \in \mathbb{Y}_m, b_1(Y'_r[i]) = b_1, \ldots, b_j(Y'_r[i]) = b_j).$$

SOFT THRESHOLD DECODING: In the iterative decoding procedure at the j-th bit plane, the information about the j-th bit from the channel is expressed in term of the log-likelihood-ratio, as follows, $$L_{ch}^{(j)}(y_{d1}|b_1, \ldots, b_{j-1}) = \log \frac{P(y_{d1}, B_1 = b_1, B_2 = b_2, \ldots, B_{j-1} = b_{j-1}|B_j = 1)}{P(y_{d1}, B_1 = b_1, B_2 = b_2, \ldots, B_{j-1} = b_{j-1}|B_j = 0)} \quad (49)$$
$$= \log \frac{P(B_1 = b_1, \ldots, B_{j-1} = b_{j-1}, B_j = 1|y_{d1})/P(B_j = 1)}{P(B_1 = b_1, \ldots, B_{j-1} = b_{j-1}, B_j = 0|y_{d1})/P(B_j = 0)}$$
$$= \log \frac{P(B_1 = b_1, \ldots, B_{j-1} = b_{j-1}, B_j = 1|y_{d1})}{P(B_1 = b_1, \ldots, B_{j-1} = b_{j-1}, B_j = 0|y_{d1})} -$$
$$\log \frac{P(B_j = 1)}{P(B_j = 0)}$$
$$\stackrel{\Delta}{=} \tilde{L}_{ch}^{(j)}(y_{d1}|b_1, \ldots, b_{j-1}) + L_{ext}(B_j).$$

where $b_1, \ldots, b_{j-1}$ are the specific realizations of the bits $B_1, \ldots, B_{j-1}$, $L_{ch}^{(j)}(y_{d1}|b_1, \ldots, b_{j-1})$ characterizes the information about the j-th bit plane given previously decoded bits $b_1, \ldots, b_{j-1}$, and it is a function of $y_{d1}$.

$$\tilde{L}_{ch}^{(j)}(y_{d1}|b_1, \ldots, b_{j-1})$$

denotes the information about the j-th bit from the "virtual" channel, and $L_{ext}(B_j)$ denotes the information provided by the distribution of the j-th bit itself. For NSQ, due to the symmetric property of $f(y_r|y_{d1})$ as shown in (10) and FIG. 8, $P(B_j=0)=P(B_j=1)=0.5$, thus $L_{ext}(B_j)=0$, and $$L_{ch}^{(j)}(y_{d1}|b_1, \ldots, b_{j-1}) = \tilde{L}_{ch}^{(j)}(y_{d1}|b_1, \ldots, b_{j-1}).$$

Figure 11A:
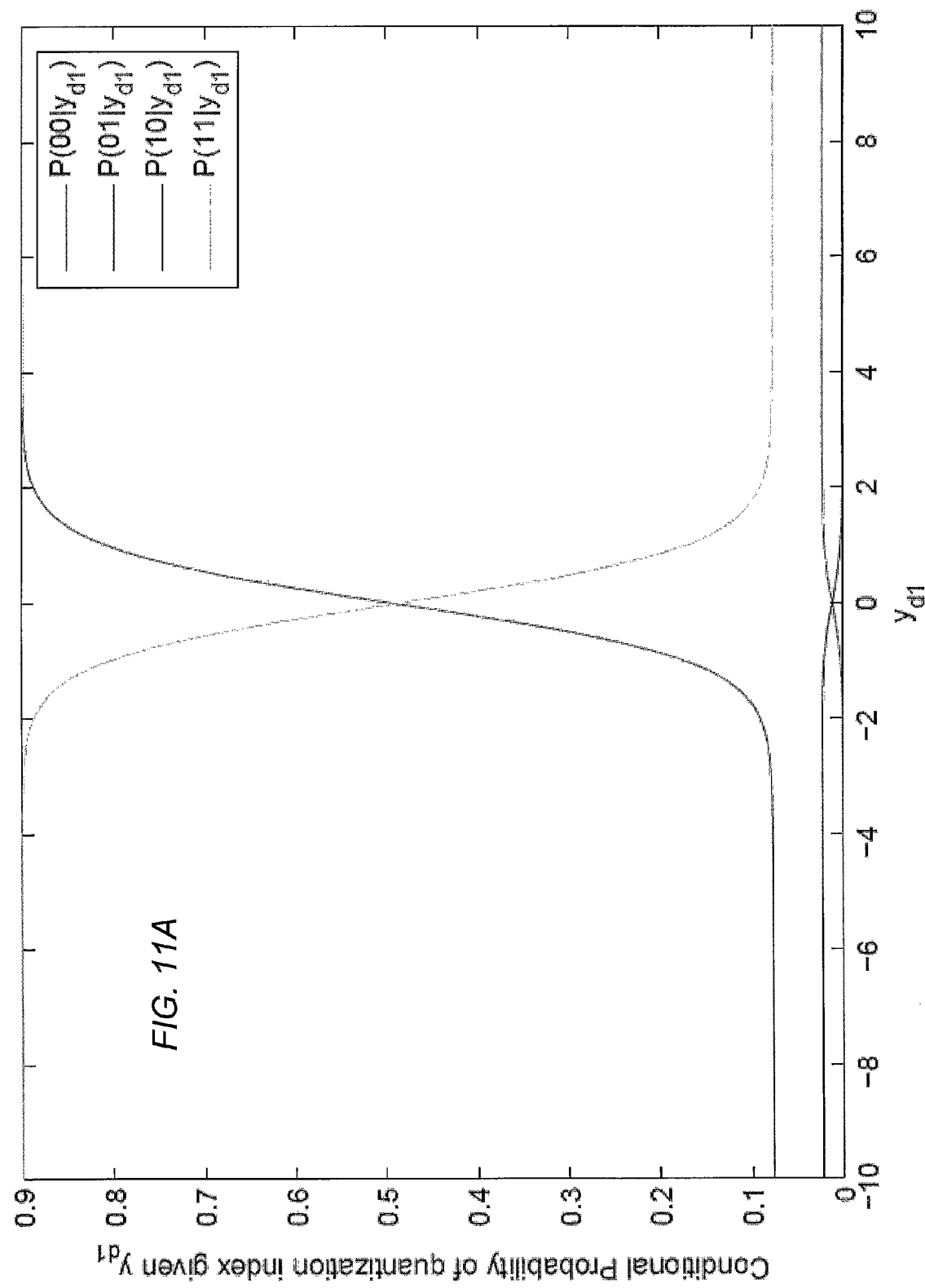
FIG. 11A illustrates the conditional probabilities of different NSQ indices given the side information $Y_{d1}$ when the nesting ratio is N=4 in the Gaussian relay setup with d=8 m.
Figure 11B:
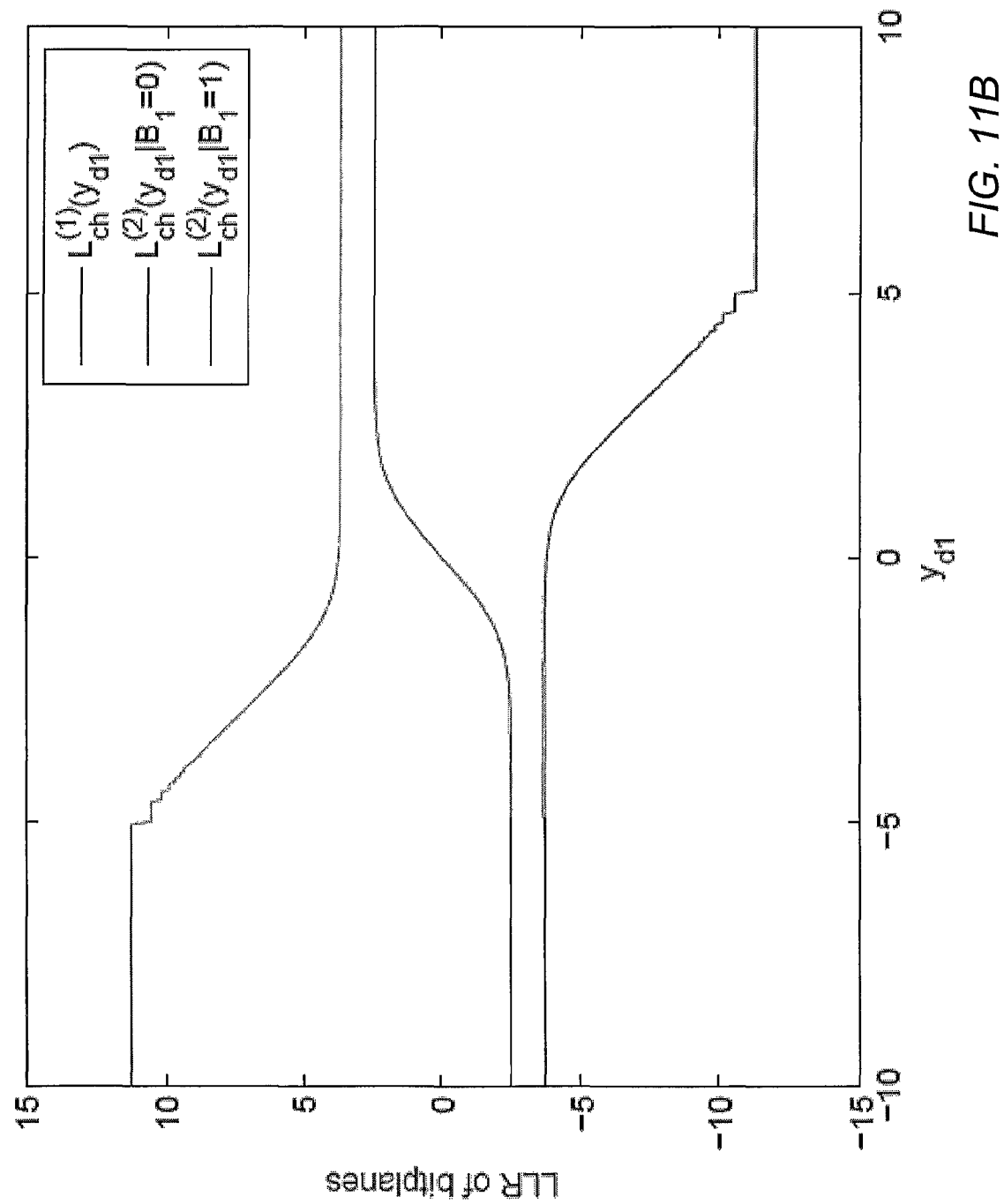

The conditional probabilities of each quantization index given the side information $Y_{d1}$ when d=8 m, and the corresponding $L_{ch}^{(j)}$ for the same d, are shown in FIGS. 11A and 11B, respectively.

C. LDPC Code Design

LDPC codes are linear codes obtained from sparse bipartite graphs. Suppose that G is a graph with n left nodes (called message nodes) and r right nodes (called check nodes). The graph gives rise to a linear code of block length n and dimension at least n-r in the following way: The n coordinates of the codewords are associated with the n message nodes. The codewords are those vectors (c1, . . . , cn) such that for all check nodes the sum of the neighboring positions among the message nodes is zero.

LDPC decoding is an iterative decoding procedure based on belief propagation, which is a special case of message passing algorithms. At each round of the algorithms messages are passed from message nodes to check nodes, and from check nodes back to message nodes. In belief propagation, the messages passed along the edges are probabilities, or beliefs. More precisely, the message passed from a message node v to a check node c is the probability that v has a certain value given the observed value of that message node, and all the values communicated to v in the prior round from check nodes incident to v other than c. On the other hand, the message passed from c to v is the probability that v has a certain value given all the messages passed to c in the previous round from message nodes other than v.

The messages/belief transmitted along the edges are random variables, therefore their probability density function is studied. The density function is updated for each circle of message passing from the message node v to check node c and then back to v. This recursion is called density evolution. Density evolution can be used to obtain asymptotic thresholds below which belief propagation decodes the code successfully, and above which belief propagation does not decode successfully. Therefore, according to the density evolution algorithm, we can optimize the density function (and therefore, the profile of the LDPC code) to get the optimal performance.

In some embodiments, the pdf's used in decoding are stored in look-up tables at nodes in the destination system.

In some embodiments, the target transmission rate is set at 0.5 bit per channel use and the average relay power $P_r$=70 dB.

In some embodiments, the DJSCC rate for each bit plane and the soft information for iterative decoding are collected off-line according to (47) and (49). The rates and IRA code profiles for each bit plane using NSQ for quantization when d=7 m and d=9 m are listed in FIGS. 12A and 12B, with nesting ration N=4 for both cases.

In some embodiments, for coding two parts of the message, $m_1$ and $m_2$, we employ two different LDPC codes designed via density evolution.

What is claimed is:

1. A method comprising:
receiving, at a relay system, an input radio frequency (RF) signal from a channel in a first interval;
recovering, using the relay system, from the input signal a stream $Y_r$ of N-PSK constellation points, wherein N is greater than one, wherein the stream $Y_r$ corresponds to a stream $X_{s1}$ of N-PSK constellation points transmitted onto the channel by a source system using N-PSK modulation;
performing, using the relay system, nested lattice quantization on the stream $Y_r$ to generate a quantization value W;
performing, using the relay system, joint source-channel encoding on the quantization value W to obtain encoded data, wherein a channel code is used for both compression and forward error protection;
converting, using the relay system, the encoded data into a stream $X_r$ of N-PSK constellation points;
generating, using the relay system, an output signal, for transmission to a destination system in a second interval, based on the stream $X_r$ of N-PSK constellation points.

2. The method of claim 1, wherein the first interval and second interval are disjoint intervals in time.

3. The method of claim 1, wherein the first interval and second interval are disjoint bands of frequency.

4. A method comprising:
receiving an input signal from a channel in a first interval;
recovering from the input signal a stream $Y_r$ of N-PSK constellation points, wherein N is greater than one, wherein the stream $Y_r$ corresponds to a stream $X_{s1}$ of N-PSK constellation points transmitted onto the channel by a source system using N-PSK modulation;
performing nested lattice quantization on the stream $Y_r$ to generate a quantization value W;
performing joint source-channel encoding on the quantization value W to obtain encoded data;
converting the encoded data into a stream $X_r$ of N-PSK constellation points;
generating an output signal, for transmission to a destination system in a second interval, based on the stream $X_r$ of N-PSK constellation points;
wherein a Voronoi volume q of a fine lattice of the nested lattice quantization is optimized to minimize a Wyner-Ziv operational distortion-rate function subject to a rate constraint.

5. A method comprising:
receiving an input signal from a channel in a first interval;
recovering from the input signal a stream $Y_r$ of N-PSK constellation points, wherein N is greater than one, wherein the stream $Y_r$ corresponds to a stream $X_{s1}$ of N-PSK constellation points transmitted onto the channel by a source system using N-PSK modulation;
performing nested lattice quantization on the stream $Y_r$ to generate a quantization value W;
performing joint source-channel encoding on the quantization value W to obtain encoded data;
converting the encoded data into a stream $X_r$ of N-PSK constellation points;
generating an output signal, for transmission to a destination system in a second interval, based on the stream $X_r$ of N-PSK constellation points;
wherein said performing joint source-channel encoding includes performing an irregular repeat accumulate (IRA) encoding on the quantization value W to obtain the encoded data.

6. A method comprising:
receiving an input signal from a channel in a first interval;
recovering from the input signal a stream $Y_r$ of N-PSK constellation points, wherein N is greater than one, wherein the stream $Y_r$ corresponds to a stream $X_{s1}$ of N-PSK constellation points transmitted onto the channel by a source system using N-PSK modulation;
performing nested lattice quantization on the stream $Y_r$ to generate a quantization value W;
performing joint source-channel encoding on the quantization value W to obtain encoded data;
converting the encoded data into a stream $X_r$ of N-PSK constellation points;
generating an output signal, for transmission to a destination system in a second interval, based on the stream $X_r$ of N-PSK constellation points;
wherein said performing joint source-channel encoding includes performing a plurality of irregular repeat accumulate (IRA) encodings on corresponding bit planes of the quantization value W to obtain the encoded data.

7. A method for decoding received information in order to recover a message m, the system comprising:

receiving a first input signal in a first interval and a second input signal in a second interval;

recovering from the first input signal a first stream $Y_{d1}$ of data and from the second input signal a second stream $Y_{d2}$ of data, wherein the first stream $Y_{d1}$ is a first channel-modified version of a stream $X_{s1}$ transmitted in the first interval by a source system using N-PSK modulation, wherein N is greater than one, wherein the second stream $Y_{d2}$ is a mixture including a channel-modified version $V_s$ of stream $X_{s2}$ transmitted in the second interval by the source system using said N-PSK modulation and a channel-modified version $V_r$ of a stream $X_r$ transmitted in the second interval by a relay system using said N-PSK modulation, wherein the relay system is configured to (a) receive stream $Y_r$ which is a second channel-modified version of the stream $X_{s1}$ transmitted by the source system, (b) perform nested lattice quantization on the stream $Y_r$ to obtain index W and (b) perform joint source-channel encoding on the index W to obtain the stream $X_r$;

generating an estimate for the index W using the first stream $Y_{d1}$ and the second stream $Y_{d2}$;

generating an estimate for the stream $Y_r$ using the estimate for the index W;

performing maximum ratio combining based on the first stream $Y_{d1}$ and the estimate for the stream $Y_r$ in order to obtain likelihood information;

performing channel decoding on the likelihood information to generate an estimate for a first portion $m_1$ of the message m.

8. The method of claim 7 further comprising:

performing said joint source-channel encoding on the index estimate to obtain an estimate for the stream $X_r$;

scaling the estimate for the stream $X_r$ to obtain an estimate for the channel-modified version $V_r$;

performing channel decoding on a difference between the second stream $Y_{d2}$ and the estimate of the version $V_r$ to generate an estimate for a second portion $m_2$ of the message m.

9. The method of claim 7, wherein the first interval and second interval are disjoint intervals in time.

10. The method of claim 7, wherein the first interval and second interval are disjoint bands of frequency.

11. The method of claim 7, wherein the iterative decoder is configured to reverse an effect of said joint source-channel encoding of the relay system.

12. A computer system comprising:

a memory medium configured to store program instructions;

a processor configured to access the program instructions from the memory medium and execute the program instructions, wherein the program instructions are executable to implement:

receiving an input signal from a channel in a first interval, wherein the input signal corresponds to an RF signal;

recovering from the input signal a stream $Y_r$ of data, wherein the stream $Y_r$ corresponds to a stream $X_{s1}$ of N-PSK constellation points transmitted onto the channel by a source system using N-PSK modulation, wherein N is greater than one;

performing nested lattice quantization on the stream $Y_r$ to generate a quantization value W;

performing joint source-channel encoding on the quantization value W to obtain encoded data, wherein a channel code is used for both compression and forward error protection;

converting the encoded data into a stream $X_r$ of N-PSK constellation points;

generating an output signal, for transmission to a destination system in a second interval, based on the stream $X_r$ of N-PSK constellation points.

13. The computer system of claim 12, wherein the first interval and second interval are disjoint intervals in time.

14. The computer system of claim 12, wherein the first interval and second interval are disjoint bands of frequency.

15. A computer system comprising:

a memory medium configured to store program instructions;

a processor configured to access the program instructions from the memory medium and execute the program instructions, wherein the program instructions are executable to implement:

receiving an input signal from a channel in a first interval;

recovering from the input signal a stream $Y_r$ of data, wherein the stream $Y_r$ corresponds to a stream $X_{s1}$ of N-PSK constellation points transmitted onto the channel by a source system using N-PSK modulation, wherein N is greater than one;

performing nested lattice quantization on the stream $Y_r$ to generate a quantization value W;

performing joint source-channel encoding on the quantization value W to obtain encoded data;

converting the encoded data into a stream $X_r$ of N-PSK constellation points;

generating an output signal, for transmission to a destination system in a second interval, based on the stream $X_r$ of N-PSK constellation points;

wherein said performing joint source-channel encoding includes performing a plurality of irregular repeat accumulate (IRA) encodings on corresponding bit planes of the quantization value W to obtain the encoded data.

16. A computer-readable memory medium configured to stored program instructions, wherein the program instructions are executable by a device to implement:

receiving an input signal from a channel in a first interval, wherein the input signal corresponds to an RF signal;

recovering from the input signal a stream $Y_r$ of data, wherein the stream $Y_r$ corresponds to a stream $X_{s1}$ of N-PSK constellation points transmitted onto the channel by a source system using N-PSK modulation, wherein N is greater than one;

performing nested lattice quantization on the stream $Y_r$ to generate a quantization value W;

performing joint source-channel encoding on the quantization value W to obtain encoded data, wherein a channel code is used for both compression and forward error protection;

converting the encoded data into a stream $X_r$ of N-PSK constellation points;

generating an output signal, for transmission to a destination system in a second interval, based on the stream $X_r$ of N-PSK constellation points.

17. The memory medium of claim 16, wherein the first interval and second interval are disjoint intervals in time.

18. The memory medium of claim 16, wherein the first interval and second interval are disjoint bands of frequency.

19. A computer system comprising:

a memory medium configured to store program instructions;

a processor configured to access the program instructions from the memory medium and execute the program instructions, wherein the program instructions are executable to implement:

receiving a first input signal in a first interval and a second input signal in a second interval;

recovering from the first input signal a first stream $Y_{d1}$ of data and from the second input signal a second stream $Y_{d2}$ of data, wherein the first stream $Y_{d1}$ is a first channel-modified version of a stream $X_{s1}$ transmitted in the first interval by a source system using N-PSK modulation, wherein N is greater than one, wherein the second stream $Y_{d2}$ is a mixture including a channel-modified version $v_s$ of stream $X_{s2}$ transmitted in the second interval by the source system using said N-PSK modulation and a channel-modified version $V_r$ of a stream $X_r$ transmitted in the second interval by a relay system using said N-PSK modulation, wherein the relay system is configured to (a) receive stream $Y_r$ which is a second channel-modified version of the stream $X_{s1}$ transmitted by the source system, (b) perform nested lattice quantization on the stream $Y_r$ to obtain index W and (b) perform joint source-channel encoding on the index W to obtain the stream $X_r$;

generating an estimate for the index W using the first stream $Y_{d1}$ and the second stream $Y_{d2}$;

generating an estimate for the stream $Y_r$ using the estimate for the index W;

performing maximum ratio combining based on the first stream $Y_{d1}$ and the estimate for the stream $Y_r$ in order to obtain likelihood information;

performing channel decoding on the likelihood information to generate an estimate for a first portion $m_1$ of the message m.

20. The system of claim 19, wherein the program instructions are further executable to implement:

performing said joint source-channel encoding on the index estimate to obtain an estimate for the stream $X_r$;

scaling the estimate for the stream $X_r$ to obtain an estimate for the channel-modified version $V_r$;

performing channel decoding on a difference between the second stream $Y_{d2}$ and the estimate of the version $y_r$ to generate an estimate for a second portion $m_2$ of the message m.

21. The system of claim 19, wherein the first interval and second interval are disjoint intervals in time or frequency.

22. A computer-readable memory medium configured to stored program instructions, wherein the program instructions are executable by a device to implement:

receiving a first input signal in a first interval and a second input signal in a second interval;

recovering from the first input signal a first stream $Y_{d1}$ of data and from the second input signal a second stream $Y_{d2}$ of data, wherein the first stream $Y_{d1}$ is a first channel-modified version of a stream $X_{s1}$ transmitted in the first interval by a source system using N-PSK modulation, wherein N is greater than one, wherein the second stream $Y_{d2}$ is a mixture including a channel-modified version $V_s$ of stream $X_{s2}$ transmitted in the second interval by the source system using said N-PSK modulation and a channel-modified version $V_r$ of a stream $X_r$ transmitted in the second interval by a relay system using said N-PSK modulation, wherein the relay system is configured to (a) receive stream $Y_r$ which is a second channel-modified version of the stream $X_{s1}$ transmitted by the source system, (b) perform nested lattice quantization on the stream $Y_r$ to obtain index W and (b) perform joint source-channel encoding on the index W to obtain the stream $X_r$;

generating an estimate for the index W using the first stream $Y_{d1}$ and the second stream $Y_{d2}$;

generating an estimate for the stream $Y_r$ using the estimate for the index W;

performing maximum ratio combining based on the first stream $Y_{d1}$ and the estimate for the stream $Y_r$ in order to obtain likelihood information;

performing channel decoding on the likelihood information to generate an estimate for a first portion $m_1$ of the message m.

23. The memory medium of claim 22, wherein the program instructions are further executable to implement:

performing said joint source-channel encoding on the index estimate to obtain an estimate for the stream $X_r$;

scaling the estimate for the stream $X_r$ to obtain an estimate for the channel-modified version $V_r$;

performing channel decoding on a difference between the second stream $Y_{d2}$ and the estimate of the version $V_r$ to generate an estimate for a second portion $m_2$ of the message m.

24. The memory medium of claim 22, wherein the first interval and second interval are disjoint intervals in time or frequency.

* * * * *

UNITED STATES PATENT AND TRADEMARK OFFICE
CERTIFICATE OF CORRECTION

PATENT NO. : 7,912,147 B2
APPLICATION NO. : 11/686019
DATED : March 22, 2011
INVENTOR(S) : Liu et al.

It is certified that error appears in the above-identified patent and that said Letters Patent is hereby corrected as shown below:

Title page, item (57), under "Abstract", in Column 2, Line 10, delete "Wyner Ziv" and insert -- Wyner-Ziv --.

Page 2, item (56), under "Other Publications", in Column 2, Line 33, delete "Achievablility" and insert -- Achievability --.

Column 25, line 10, in Claim 19, delete "$v_s$" and insert -- $V_s$ --.

Column 25, line 38, in Claim 20, delete "$y_r$" and insert -- $V_r$ --.

Signed and Sealed this
Ninth Day of August, 2011

David J. Kappos
*Director of the United States Patent and Trademark Office*